United States Patent
Tsuchiya et al.

(10) Patent No.: US 6,774,570 B2
(45) Date of Patent: Aug. 10, 2004

(54) RF PLASMA PROCESSING METHOD AND RF PLASMA PROCESSING SYSTEM

(75) Inventors: Nobuaki Tsuchiya, Tokyo (JP); Yasumi Sago, Tokyo (JP); Masayoshi Ikeda, Tokyo (JP)

(73) Assignee: Anelva Corporation, Fuchu (JP)

( * ) Notice: Subject to any disclaimer, the term of this patent is extended or adjusted under 35 U.S.C. 154(b) by 0 days.

(21) Appl. No.: 10/359,081

(22) Filed: Feb. 6, 2003

(65) Prior Publication Data

US 2003/0151372 A1 Aug. 14, 2003

(30) Foreign Application Priority Data

Feb. 8, 2002 (JP) ........................................ 2002-033167

(51) Int. Cl.$^7$ ................................................ H01J 7/24
(52) U.S. Cl. ............................ 315/111.21; 315/111.51; 156/345
(58) Field of Search ...................... 315/111.21, 111.31, 315/111.51, 111.71, 111.81, 111.91; 219/121.43, 121.54, 121.57; 356/316; 156/345; 118/723 I, 723 IR, 723 E, 723 R

(56) References Cited

U.S. PATENT DOCUMENTS

| | | | |
|---|---|---|---|
| 4,464,223 A | 8/1984 | Gorin .......................... | 438/729 |
| 4,579,618 A | 4/1986 | Celestino et al. ....... | 156/345.44 |
| 4,585,920 A | 4/1986 | Hoog et al. ............. | 219/121.52 |
| 4,720,628 A | 1/1988 | Drake, Jr. ................ | 250/214 R |
| 4,780,169 A | 10/1988 | Stark et al. .............. | 156/345.34 |
| 5,210,466 A | 5/1993 | Collins et al. ........... | 315/111.21 |
| 5,300,460 A | 4/1994 | Collins et al. ............. | 438/712 |
| 5,392,018 A | 2/1995 | Collins et al. .............. | 336/155 |
| 5,656,123 A | 8/1997 | Salimian et al. ........ | 156/345.43 |
| 5,824,607 A | 10/1998 | Trow et al. .................. | 438/732 |
| 5,888,414 A | 3/1999 | Collins et al. ................. | 216/68 |
| 5,892,198 A * | 4/1999 | Barnes et al. .......... | 219/121.54 |
| 5,971,591 A * | 10/1999 | Vona et al. ............. | 364/478.08 |
| 6,027,601 A * | 2/2000 | Hanawa ...................... | 156/345 |
| 6,031,198 A * | 2/2000 | Moriyama et al. ..... | 219/121.57 |
| 6,526,355 B1 * | 2/2003 | Ni et al. .................. | 315/111.21 |

FOREIGN PATENT DOCUMENTS

| | | |
|---|---|---|
| JP | 63-50025 | 3/1988 |
| JP | 08-31753 | 2/1996 |
| JP | 10-261498 | 9/1998 |
| JP | 2000-156374 | 6/2000 |
| JP | 2000-345339 | 12/2000 |

OTHER PUBLICATIONS

DPS 1998, Proceedings of Symposium on Dry Process, Nov. 11–13, 1998, Tokyo, at Waseda university, International Conference Center, the Institute of Electrical Engineers of Japan, pp. 229–234.

* cited by examiner

*Primary Examiner*—James Vannucci
*Assistant Examiner*—Jimmy T. Vu

(57) ABSTRACT

This application discloses the technique of the RF plasma processing using two RF waves of different frequencies, where plasma is generate and retained sufficiently and stably. The first frequency is for generating plasma by igniting a discharge, and the second frequency is for generating self-biasing voltage at a substrate to be processed. The wave of the second frequency is applied with a time-lag after applying the RF wave of the first frequency. This application also discloses the impedance matching technique in the RF plasma processing, where impedance to be provided is optimized both for igniting the discharge and for stabilizing the plasma.

30 Claims, 23 Drawing Sheets

RF PLASMA PROCESSING METHOD AND RF PLASMA PROCESSING SYSTEM

BACKGROUND OF THE INVENTION

1. Field of the Invention

This invention relates processes utilizing plasmas generated by Radio-Frequency (RF) waves. Particularly, this invention relates processes using RF waves of different frequencies at the same time.

2. Description of the Related Art

Processes utilizing plasmas generated by energy of RF waves, which are hereinafter called "RF plasma processes" or "RF plasma processing", are very practical in manufacturing semiconductor devices such as large-scale integrated circuits (LSIs) and display devices such as liquid crystal displays (LCDs). In such processes, RF waves of higher frequencies such as in Very-High Frequency (VHF) i.e. 30 MHz to 300 MHz, have been used more often. This point will be described as follows.

One reason higher-frequency waves are used is on the demand for lowering pressures in processes. The demand of lowering process pressures is much relevant to further upgrade of integration levels, i.e. advancing fineness of circuits. As fineness of a circuit is advanced, product defects would be brought with high probability even when very little foreign particles, e.g. dust, are included. Therefore, it is seriously required to prevent inclusion of foreign particles by lowering pressures during processes.

To lower process pressures is, on the other hand, significant factor from view of enabling formation of finer patterns. For example, as fineness of patterns is advanced, aspect ratios of holes such as contact holes and via holes tend to increase. For forming holes of high aspect ratios, technique of reactive ion etching (RIE) is often used. In the RIE, ions extracted from plasma are made incident onto a substrate. For forming a hole of high aspect ratio by ion incidence, it is required to accelerate ions and make them incident perpendicularly onto the substrate. However, ions would be incident obliquely onto the substrate, because they change their travel directions with collision to gas molecules. This easily takes place in ambience of a higher pressure. As a result of oblique incidence of ions, a large number of ions reach to side walls of the hole, bringing the problem of so called waist-swelling, i.e. bowing shape of the hole.

In plasma chemical vapor deposition where a film is deposited utilizing gas-phase reaction in plasma, a higher pressure increases the probability that activated species produced in the plasma are deactivated by collisions. As a result, a large number of unreacting products so called "dust" remain, which may cause pollution of environment in the process chamber easily. While a film is deposited onto the surface of a substrate, side products of low vapor-pressures sometimes evaporate from the surface. When the process chamber is at a high pressure, they may return to the surface of the substrate and stay there, degrading property of the film.

From these points, the demand for more-lowered process-pressures has been strong in this field. The demand for process speeding-up is also still strong for upgrading productivity. For speeding up processes, generally, it is required to increase plasma density, i.e. numeral density of charged particles in plasma. However, to speed up a process and to lower the pressure in the process conflict with each other in a sense. That is, the number of gas molecules is reduced more if the pressure is lowered more, which decreases the plasma density inevitably.

Enhancement of plasma-generation efficiency is realized much important for maintaining plasma density high enough even when pressure is lowered. This point is the background of that a higher frequency has been adopted in RF plasma processes. Concretely, previous processes often adopted frequencies in the MF (Medium Frequency) band, i.e. 300 kHz to 3000 kHz, and in the HF band, i.e. 3 MHz to 30 MHz. However, frequencies in the VHF band have been adopted in many recent processes. A Higher frequency shortens alternation cycles of traveling directions of electrons following an alternate electric field. This increases the probability of electrons to collide with neutral gas molecules, enhancing plasma-generation efficiency.

However, in case a process is carried out utilizing plasma generated by the wave of a higher frequency as in the VHF band, another problem may arise from view of securing high process-property and high process-reproducibility. For example, in plasma processing, ions are often extracted from plasma and made incident onto a substrate as in the described RIE. For the ion incidence, it is required to apply an electric field where its potential drops gradually from the plasma toward the substrate. This electric field generally corresponds to sheath electric field. Sheath electric field is one appearing between plasma and a solid contacting to the plasma. In plasma processing, when a substrate is given floating potential by being insulated from the ground, it is enabled to apply a sheath electric field, which is negative against the plasma potential of plasma ($\approx$0V). This negative sheath electric field extracts ions from the plasma and makes them incident onto the substrate.

However, heightening frequency of a wave for plasma generation brings the problem of weakening the sheath electric field This results from that not only ions but also electrons are difficult to follow the field alternation because the frequency is too high. Ion incidence onto a substrate is often carried out by generating self-biasing voltage at the substrate, which is enabled by applying an RF voltage to the substrate. However, if a higher-frequency voltage such as in the VHF band is applied for generating the self-biasing voltage, sufficient volume of the self-biasing voltage cannot be generated because movement of electros following the field alternation is decreased.

In addition, in such a process as plasma CVD, quantity of ion incidence and level of incidence energy must be maintained within an optimum range because they affect the process. On the other hand, there is another optimum condition in applying the RF wave for the plasma generation, which is often incompatible with the optimum condition of the ion incidence.

Considering these points, recently two different frequencies have been adopted. For example, one for plasma generation is in the VHF band, and the other one for ion incidence onto a substrate is in the HF band that is lower than the VHF band.

From the research by the inventor, however, it turned out that usage of two different frequencies such as in the VHF band and the HF band brings some problems that cannot be disregarded. Concretely, it brings the problem that the plasma cannot be retained well because coupling of RF energy with the plasma becomes insufficient, and the problem that the plasma becomes unstable in its initial state.

SUMMARY OF THE INVENTION

This invention is to solve the above-described problems, and brings advantages in RF plasma processing that uses two different frequencies. This invention enables to generate and retain plasma sufficiently and stably. This invention enables to enjoy the merits of the dual-frequency plasma processing. The method of this invention comprises a step for applying an RF wave of a first frequency to discharge space, thereby igniting RF discharge of a process gas at the discharge space, and a step for applying another RF wave of a second frequency to the discharge space with a time lag after igniting the RF discharge. The method of this invention also comprises a step for performing a first stage of impedance matching control by providing impedance optimized for igniting the discharge, when application of the wave of the first frequency is started, and a step for switching the impedance matching control to a second-stage that is performed by providing impedance optimized for stabilizing the plasma. The method of this invention also comprises a step for starting igniting the discharge as impedance matching is performed by providing impedance of a preset value optimized for igniting the discharge, a step for fixing impedance to be provided at the preset value for a preset time, a step for monitoring the reflected wave from the discharge space by a monitor, and a step for carrying out an automatic control of impedance provision so as to minimize the reflected wave from the discharge space, according to the signal from the monitor. The system of this embodiment comprises a controller in which a sequence control program. The sequence control program executes the steps as in the above method.

In the Figures, "PGPS" stands for "plasma-generation power source", "IIPS" stands for "ion-incidence power source". "P. D. I. P." means "preset discharge-ignition point", "B. P." means "best point", "P. B. P" means "preset best point", and "P. G." means "plasma generation".

DETAILED DESCRIPTION OF THE PREFERRED EMBODIMENTS

Figure 1:
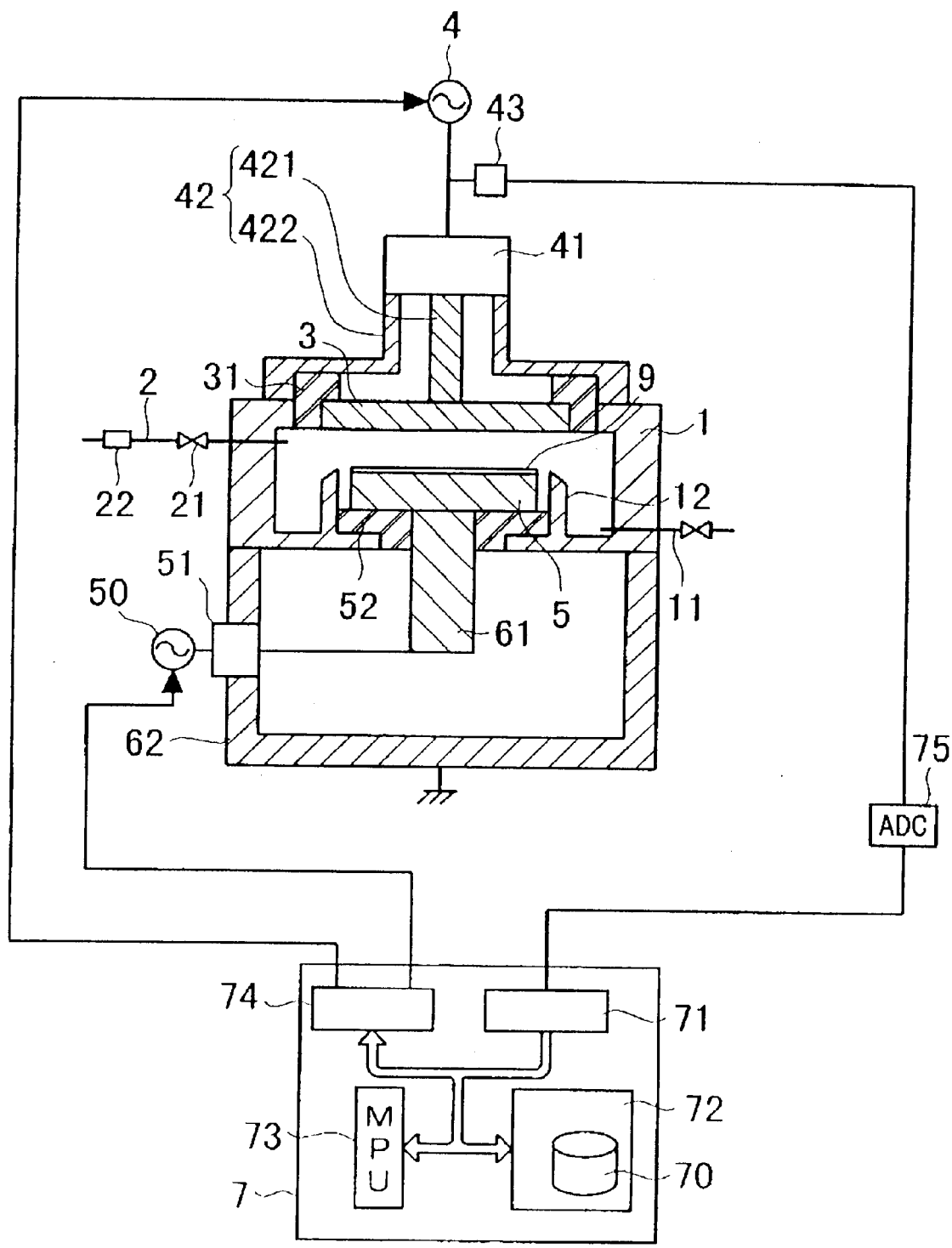
FIG. 1 is the schematic front cross-sectional view of the RF plasma processing system as the first embodiment of the invention.

The preferred embodiments of this invention will be described as follows. FIG. 1 is the schematic front cross-sectional view of the RF plasma processing system as the first embodiment of the invention. The system shown in FIG. 1 comprises a process chamber 1 having a pumping line 11, a process-gas introduction line 2 for introducing a process gas into the process chamber 1, a plasma-generation means for generating plasma in the process chamber 1 by igniting an RF discharge with the introduced process gas, and a substrate holder 5 for holding the substrate 9 at a required position where the substrate 9 is processed utilizing the generated plasma.

The plasma-generation means comprises an RF electrode 3, and an RF power source 4 to apply an RF voltage to the RF electrode 3, thereby generating the plasma. The RF power source 3 is hereinafter called "plasma-generation power source". This system comprises another RF power source 50. The RF power source 50 is provided for extraction ions from the plasma and making them incident onto the substrate 9, separately from the plasma-generation power source 4. The power source 50 is hereinafter called "ion-incidence power source". The ion-incidence power source 50 is connected with the substrate holder 5.

The process chamber 1 is the airtight vacuum chamber. A load-lock chamber (not shown) is connected with the process chamber 1, interposing a gate-valve (not shown). The pumping line 11 is capable of pumping the process chamber 1 at a required vacuum pressure by a vacuum pump such as turbo-molecular pump or diffusion pump.

The system shown in FIG. 1 is the one for carrying out an etching process. Concretely, the process-gas introduction line 2 introduces the process gas having an etching function, e.g. fluoride gas. The process-gas introduction line 2 comprises a valve 21 and a gas-flow controller 22, through which the process gas is introduced.

The RF electrode 3 is circular-board-shaped, facing in parallel to the substrate holder 5. The RF electrode 3 is fitted air-tightly with the upper wall of the process chamber 1, interposing the insulator 31. The plasma-generation power source 4 is connected with the RF electrode 3 via an impedance matching element 41. The impedance matching element 41 is hereinafter called "plasma-generation matching element". A coaxial tube 42 is employed as the transmission line from the impedance matching element 41 to the RF electrode 3. The coaxial tube is essentially composed of an inner conductor 421 and an outer conductor 422. The outer conductor 422 is cylindrical and coaxial to the inner conductor 421. The coaxial tube 42 is coaxial to the RF electrode 3.

The substrate holder 5 is the one for holding the substrate 9 on the top surface. The substrate 9 is held at the position in coaxial to the RF electrode 3. The substrate 9 is thin and circular-board-shaped. The RF electrode 3 and the substrate holder 5 are also cylindrical.

The substrate holder 5 has the function to electro-statically chuck the substrate 9. Not clearly shown in FIG. 1, the upper portion of the substrate holder 5 is made of dielectric, in which a chucking electrode (not shown) is buried. A chucking power source (not shown) is provided to apply a DC voltage to the chucking electrode. When the DC voltage is applied, static electricity is induced on the top surface of the substrate holder 5, thereby chucking the substrate 9 electro-statically.

The substrate holder 5 is commonly used as another RF electrode, which forms discharge space together with the RF electrode 3. The substrate holder 5 is located coaxially to the RF electrode 3, facing in parallel to it. In other words, the substrate holder 5 and the RF electrode 3 compose the parallel-planar-electrodes structure.

A coaxial cylinder 62 is provided downward on the base plate of the process chamber 1. The cylinder 62 has a bottom plate. The cylinder 62 is made of metal and grounded at the center on the bottom plate. Therefore, the process chamber 1 is at the ground potential in view of DC. The substrate holder 5 is insulated from the process chamber 1 by an insulator 52. Therefore, the substrate holder 5 floats up from the ground, being at the floating potential.

The substrate holder 5 is supported by a column 61 provided coaxially. The cylinder 62, the column 61, the substrate holder 5 and the process chamber 1 are all coaxial to each other. The ion-incidence power source 50 is connected via the column 61 made of metal. An impedance matching element 51 is provided at the cylinder 62. The ion-incidence power source 50 applies the RF voltage to the substrate holder 5 via the impedance matching element 51. The impedance matching element 51 is hereinafter called "ion-incidence matching element".

A shield 12 is provided, surrounding the substrate holder 5. The shield 12 is cylindrical and coaxial to the substrate 9 as well as the substrate holder 5. The shield 12 is to prevent discharge around the substrate holder 5. The substrate holder 5, the shield 12, the base plate of the process chamber 1, the cylinder 62, the column 61 and other components preferably compose a resonator that resonates at the frequency of the plasma-generation power source 4. This is because the resonance makes the substrate holder 5 be in the grounded state in view of RF. In the resonant state, the RF voltage applied between the RF electrode 3 and the substrate holder 5 is maximized, making the RF discharge most efficient.

Now, the system of this embodiment is one of dual-frequency type as described. Specifically, the plasma-generation power source 4 generates the RF wave of a frequency in the VHF band, e.g. 60 MHz. On the other hand, the ion-incidence power source 50 generates the RF wave of a frequency in the HF band, e.g. 13.56 MHz. Output level of the plasma generation power source 4 is 500W to 10 kW, and that of the ion-incidence power source 50 is 0 to 10 kW.

The system of this embodiment comprises a power-supply monitor 43. The power-supply monitor 43 monitors ratio of the reflected-wave power against the progressive-wave power on the transmission line from the plasma-generation power source 4 to the RF electrode 3. The power-supply monitor 43 can be one comprising a directional coupler.

One point greatly characterizing this embodiment is that a controller 7 is provided for controlling operation timing of the plasma-generation power source 4 and the ion-incidence power source 50. This control is to optimize the dual-frequency plasma processing. Including this operation-timing control, the controller 7 performs sequence control for each part of the system. The controller 7 comprises an input port 71 through which signals for the sequence control are input, a memory or storage 72 at which a sequence-control program 70 is installed, a processor 73 that executes the sequence-control program 70 according to the signals from the input port 71, and an output port 74 through which signals for the sequence control are output. An AD (Analog to Digital) converter 75 is provided on the line from the power-supply monitor 43 to the input port 71. In addition to the power-supply monitor 43, the system comprises monitors and detectors (not shown) for monitoring each part of the system. Signals from them are input to the input port 71 via other AD converters (not shown).

Figure 2:
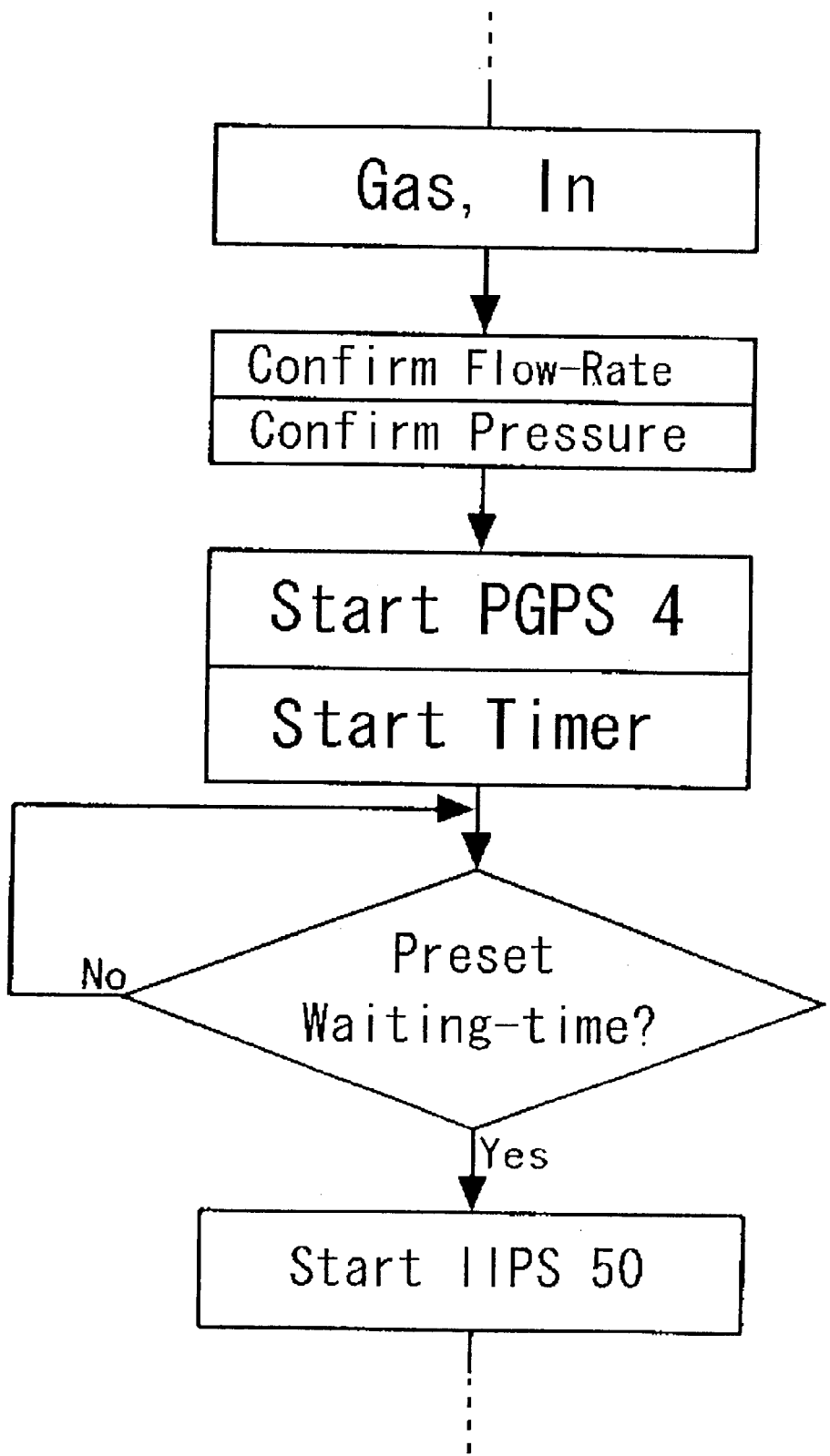
FIG. 2 is the schematic flow-chart of the sequence control program 70 installed in the controller 7 shown in FIG. 1.
Figure 3:
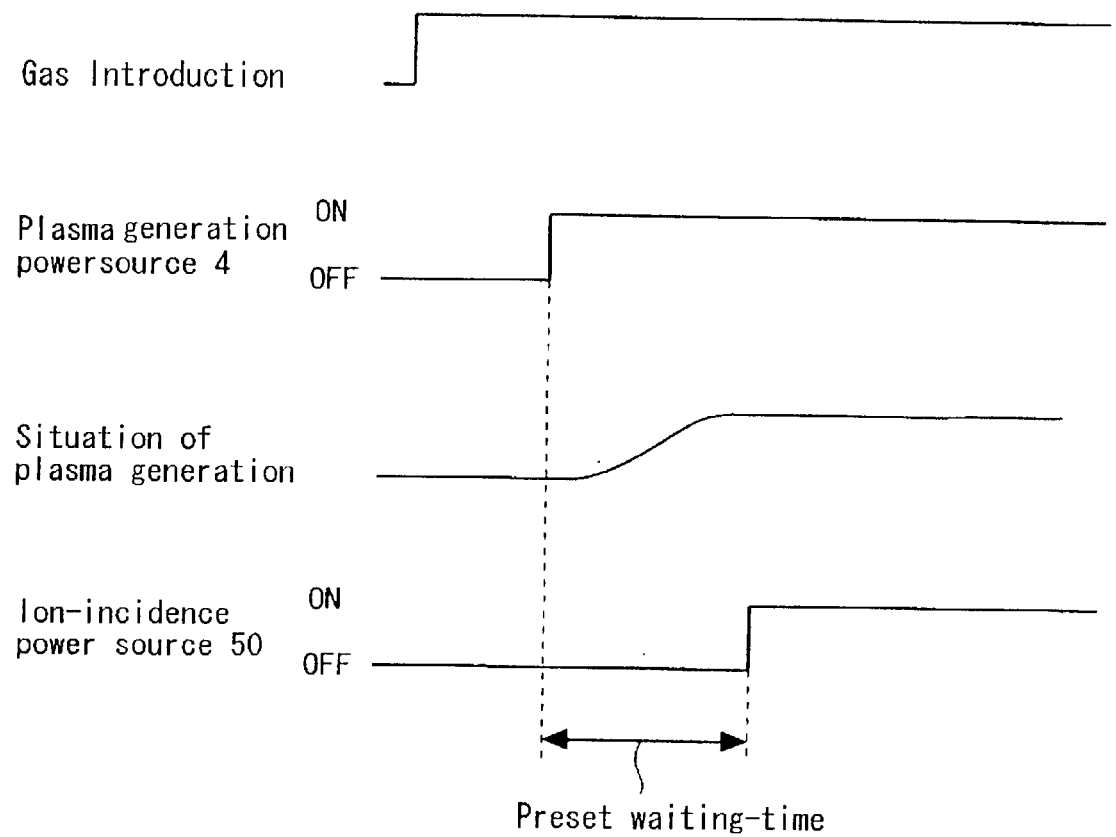
FIG. 3 is the timing chart on operations of the plasma-generation power source 4 and the ion-incidence power source 50 in the sequence control program 70 shown in FIG. 2.

Referring to FIG. 2 and FIG. 3, the sequence-control program 70 installed in the controller 7 will be described as follows. The following description corresponds to description about the embodiment of the RF plasma processing method. FIG. 2 is the schematic flow-chart of the sequence control program 70 installed in the controller 7 shown in FIG. 1. FIG. 3 is the timing chart on operations of the plasma-generation power source 4 and ion-incidence power source 50 in the sequence control program 70 shown in FIG. 2. FIG. 2 schematically shows the excerpted parts of the plasma generation and the voltage supply for the ion-incidence. The part of "situation of plasma generation" in FIG. 3 schematically shows transition of gaseous ionization degree at the discharge space. Plasma can be regarded as "stably generated" when ionization degree settles at a stable high value after increasing.

The process chamber 1 is pumped by the pumping line 11 down at a required vacuum pressure in advance. The sequence control starts with process-gas introduction by the gas-introduction line 2. The controller 7 feeds the signal to the gas-introduction line 2 to introduce the process gas at a required flow-rate. The controller 7 also feeds the signal to the pumping line 11 to keep the vacuum pressure in the process chamber 1 at a required value.

After confirming the pressure and the flow rate are kept at the required values by a flow-rate monitor (not shown)

provided on the gas-introduction line 2 and a vacuum gauge (not shown) provided on the pumping line 11, the sequence control program 70 initially starts operation of the plasma-generation power source 4. The RF voltage is applied to the RF electrode 3 via the plasma-generation matching element 41. Simultaneously with the start of operation of the plasma-generation power source 4, the sequence control program 70 starts a timer. When the timer reaches a preset waiting-time, the sequence control program 70 starts operation of the ion-incidence power-source 50. The RF voltage is applied to the substrate holder 5 to generate the self-biasing voltage at the substrate 9. As a result, the electric field for the ion-incidence is provided.

In the sequence control program 70, the preset waiting-time is provided as a time lag after the start-up of the plasma-generation power source 4 until the start-up of the ion-incidence power source 50. The preset waiting-time is determined so that the ion-incidence RF voltage can be applied to the substrate holder 5 after the plasma settles to be in a stable state. This point will be described in detail as follows.

From the research by the inventors, it turned out that the critical error of the plasma-generation incapability may occur when operations of a VHF power source, such as the plasma-generation power source 4, and an HF power source, such as the ion-incidence power source 50, are started simultaneously. Concretely, if operations of two power sources of different frequencies are started at the same time, the power sources may be forcedly stopped by protection circuits before the plasma transits to a stable state.

Figure 4:
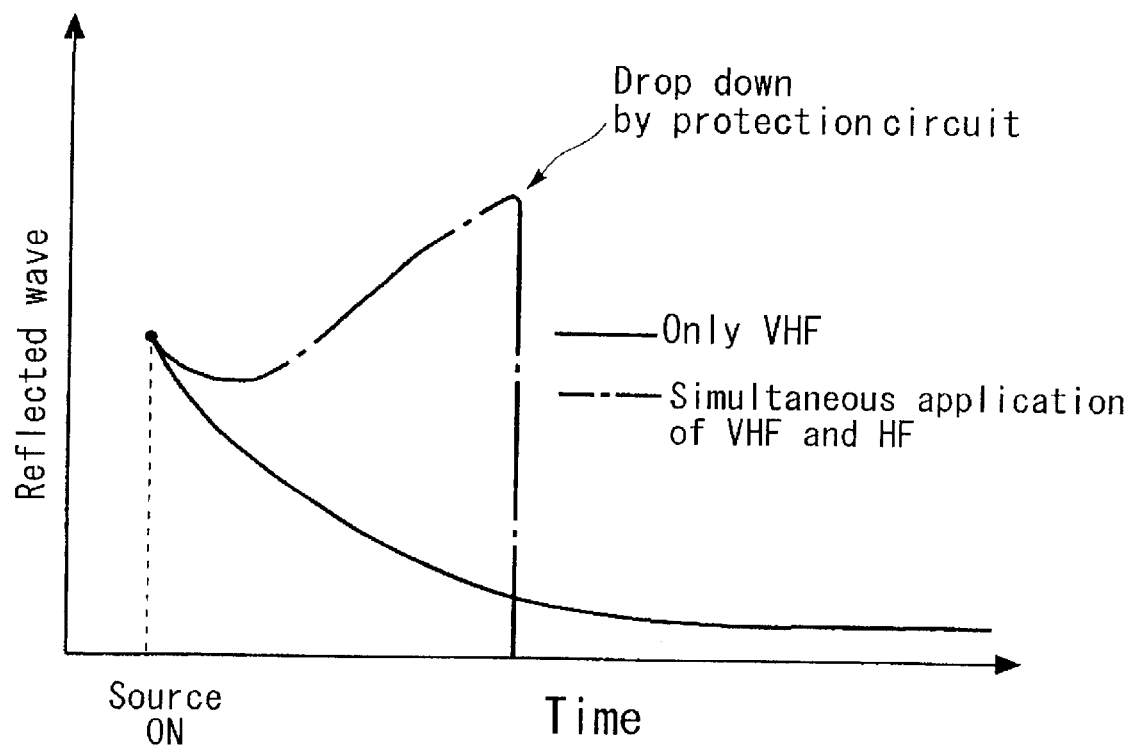
FIG. 4 shows progress of a reflected-wave volume in generating plasma by an RF gaseous discharge as impedance matching is performed by an impedance matching element.

FIG. 4 shows progress of reflected-wave volume in generating plasma by an RF gaseous discharge as impedance matching is performed by an impedance matching element. As known, in the mechanism of plasma generation by an RF gaseous discharge, an initial ionization takes place from that a primitively-existing electron is accelerated by an electric field and collides with a neutral gas molecule. The secondary electron released by the initial collision further collides with another neutral gas molecule, ionizing it. As such the steps are repeated, the numbers of electrons and ions rapidly increase, thus igniting the discharge. Afterward, the ionization becomes dominant among the gas molecules. As a result, the gas transits to the state of plasma.

Usually, an impedance matching element provided between an RF power source and a discharge space as the load, such as the plasma-generation matching element 41 in this embodiment, is designed so that impedance of the load side can be optimized at the moment of the plasma generation. In other words, it is designed so that at the moment of the plasma generation the load-side impedance can accurately match the characteristic impedance of the line, which minimizes the reflected wave and maximizes the power coupled with the plasma.

Here, as shown in FIG. 4, in the initial state when the RF voltage is applied, the gaseous ionization degree at the discharge space is still low and the space impedance is still high. Therefore, the circuit is slightly out of the optimum matching state, having some volume of the reflected wave. However, the RF power is continuingly supplied to the discharge space. As the supplied power promotes ionization of neutral gas molecules, the ionization degree of the gas gradually increases. The gas transits close to the plasma state. Accompanied by this, the impedance at the discharge space gradually decreases. Because the load-side impedance including impedance at the discharge space becomes close to the value that matches the characteristic impedance, the reflected wave also decreases gradually. When the plasma has transited to a stable stage, the reflected wave settles at a stable low volume as well.

The RF power source is usually controlled so that the output level can be constant. A reflected-wave monitor is provided for monitoring the reflected wave from the load. In addition, a protection circuit is provided to protect the RF power source. The output voltage of the RF power source automatically drops down by the protection circuit when the reflected wave increases excessively.

Figure 5:
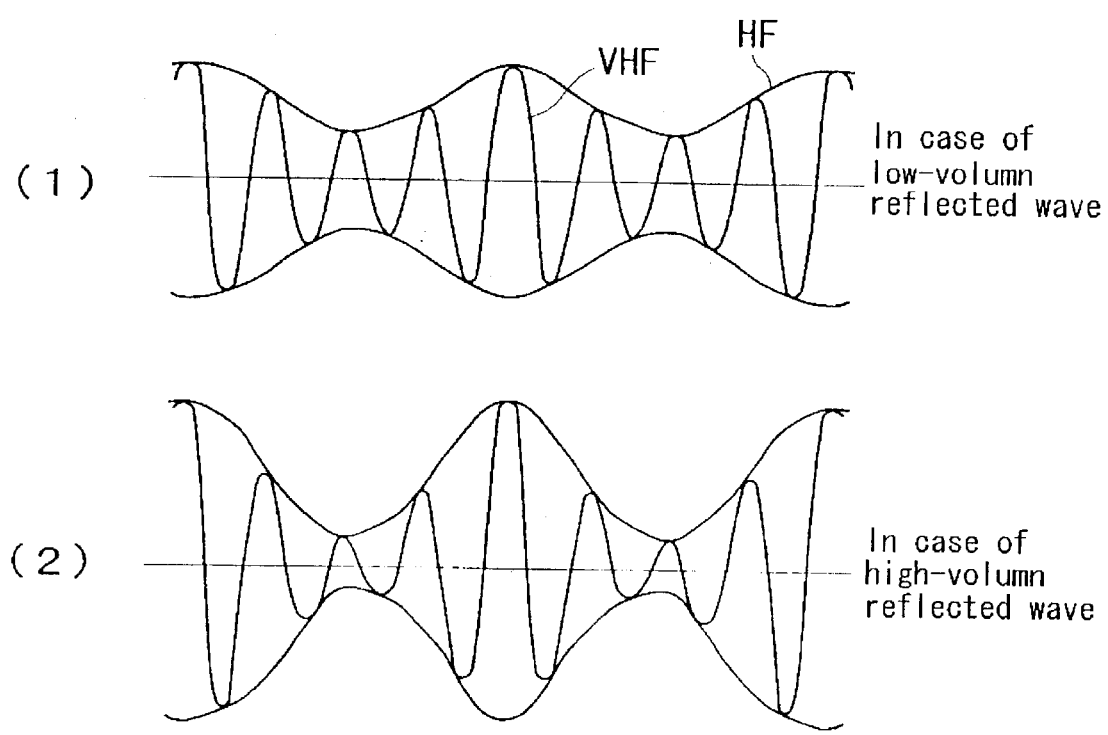
FIG. 5 shows the VHF wave modulated with the HF wave.

In such plasma generation by an RF gaseous discharge, generally, when an RF wave in the HF band is applied for a purpose in addition to an RF wave in VHF band for plasma generation, the reflected wave of the VHF band sometimes would not decrease but increase, as shown in FIG. 4. When a VHF wave and an HF wave are applied to the same discharge space, the electric field at the discharge space is in the state that the VHF wav is modulated with the HF wave. In this state, the reflected VHF wave returning to the power-source side is also modulated with the HF wave. FIG. 5 shows the VHF wave modulated with the HF wave. FIG. 5(1) shows modulation in case that the HF wave is applied after applying the VHF wave and completing the optimum impedance matching. FIG. 5(2) shows modulation in case that the HF wave is applied after the VHF wave is applied and before the optimum impedance matching is completed.

As shown in FIG. 5(1), when the HF wave is applied to the discharge space where the VHF wave has been already applied in the state of the optimum impedance matching, the reflected VHF wave modulated with the HF wave does not have a large peak because the reflection itself is small. Contrarily, as shown in FIG. 5(2), in case the HF wave is applied when the discharge space is not in the sate of the optimum impedance matching at the frequency of the applied VHF wave, the reflected VHF wave modulated with the HF wave has a large peak because the reflection itself is large. The reflected-wave monitor captures such a large peak and sends a warning signal to the protection circuit. As a result, the protection circuit makes the power source for the VHF wave drop down, as shown in FIG. 4.

The preset waiting-time in this embodiment is from the investigation and the consideration as described above. The object of the preset waiting-time is to superpose the RF wave for the ion incidence in the state the reflected wave of the first frequency from the RF electrode 3 is not excessively large. For this object, the preset waiting-time is provided to start operation of the ion-incidence power source 50, after the discharge space transits to the optimum matching state. In this embodiment, it is about one second the period from the start of the RF voltage supply until the stabilization of the plasma under the optimum impedance matching. Accordingly, the preset waiting-time is two seconds in this embodiment, including the safety margin.

Following is the description about whole operation of the system of this embodiment, which is common to description about the RF plasma processing method as the embodiment. The substrate 9 is transferred into the load-lock chamber (not shown) from the atmosphere side. After pumping the load-lock chamber and the process chamber 1 at a required vacuum pressure, a gate valve (not shown) is opened. Then, the substrate 9 is transferred into the process chamber 1 by a transfer mechanism (not shown). The substrate 9 is placed at the required position on the substrate holder 5. The chucking power source (not shown) is operated to chuck the substrate 9 on the substrate holder 5.

After closing the gate valve, the process gas introduction line 2 is operated, thereby introducing the process gas having an etching function at a required flow-rate. In this state, initially operation of the plasma-generation power source is started as described, thereby igniting the RF discharge to generate plasma. After the preset waiting-time has passed, operation of the ion-incidence power source 50 is started, thereby generating the self-biasing voltage at the substrate 9. Radicals, activated species and ions are produced in the plasma. Those species reach the substrate 9, thereby etching the surface of the substrate 9.

In etching silicon oxide, for example, a gas mixture of fluorocarbon 14 ($CF_4$) and hydrogen ($H_2$) is introduced as the process gas. In the plasma are produced radicals, activated species and ions of fluoride or fluorine, and radicals, activated species and ions of hydrogen. Those species react with silicon oxide existing at the surface of the substrate 9, producing volatile substances such as silicon fluoride and water. Under such the mechanism, the etching of the silicon oxide is carried out. Because the self-biasing voltage is generated at the substrate 9, it is enabled to promote the etching by the bombardment energy of incident ions, and to obtain the good etching configuration with the small side-etching by ions incident perpendicularly onto the substrate 9.

After carrying out such the etching for a required time, the operations of the plasma-generation power source 4, the ion-incidence power source 50 and the process-gas introduction line 2 are stopped. The process chamber 1 is pumped again, and the substrate 9 is released from the electrostatic chuck. Then, the substrate 9 is picked up from the substrate holder 5, and transferred out to the atmosphere side via the load-lock chamber. Repeating such the steps, the by-pieces etching process is carried out onto each substrate 9.

The system of this embodiment as described is free from the accident that the plasma-generation power source 4 drops down from the unexpected increase of the reflected wave. This is because HF-power supply by the ion-incidence power source 50 is started after the optimum impedance matching is established at the discharge space to which the VHF power has been supplied by the plasma-generation power source 4. Therefore, the system is capable of generating the plasma stably all the time, being highly reliable.

Figure 6:
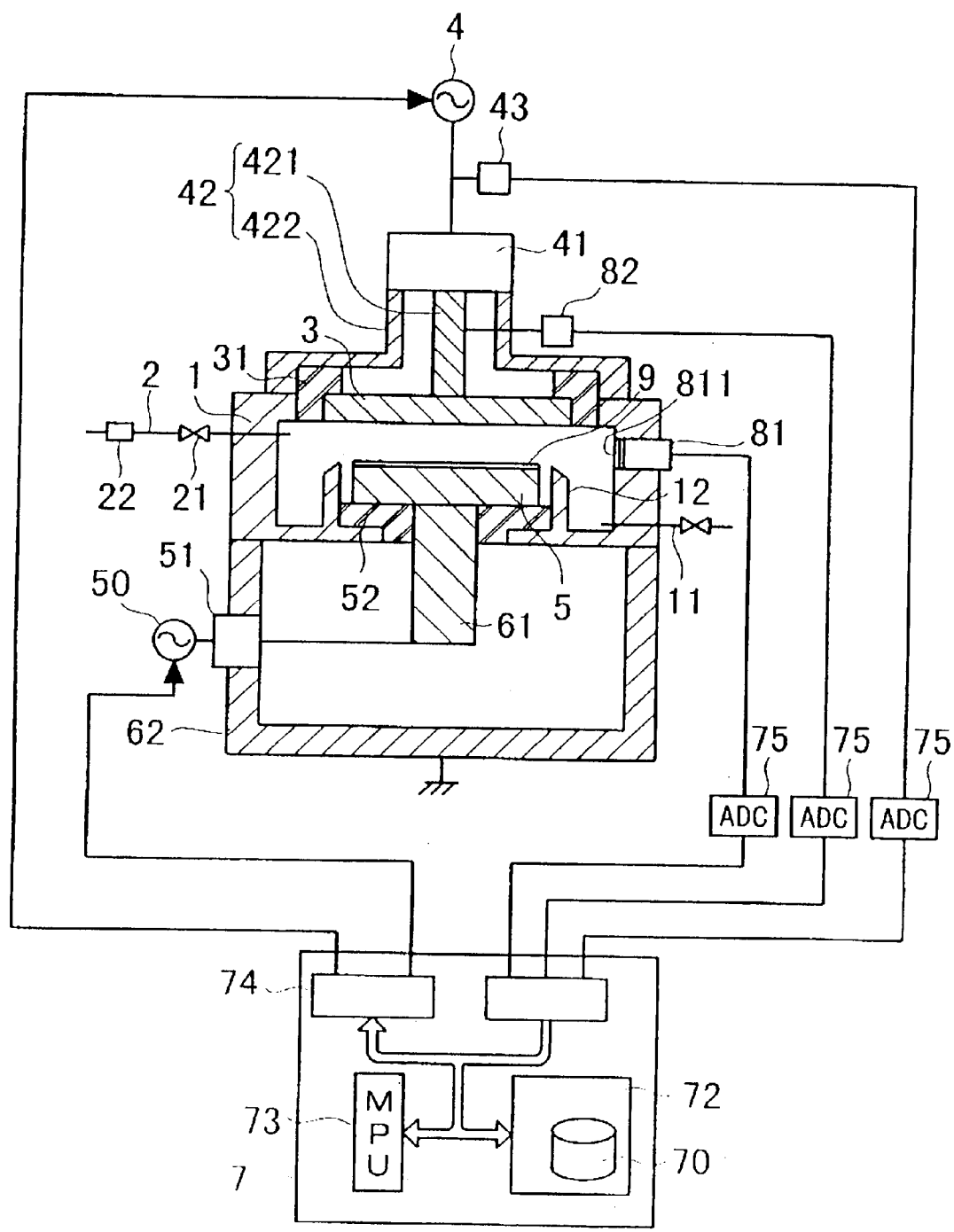
FIG. 6 is the schematic front cross-sectional view of the RF plasma processing system as the second embodiment of the invention.

Next, the system as the second embodiment of this invention will be described. FIG. 6 is the schematic front cross-sectional view of the RF plasma processing system as the second embodiment of the invention. For further optimization, this system comprises means for confirming plasma-generation. Accompanied by this, the sequence control program 70 at the controller 7 is modified.

As means for confirming plasma-generation, the system comprises a couple of members. One is a plasma monitor 81 to monitor the plasma generated in the process chamber 1. The other one is a self-biasing-voltage detector 82 to detect generation of the self-biasing voltage at the RF electrode 3. The system is not always required to comprise both of the members. Either one is enough for confirming the plasma generation.

The plasma monitor 81 monitors the plasma generation by accepting lights emitted from the plasma. Concretely, the plasma monitor 81 comprises an optical measuring instrument such as an illuminance meter or spectroscope. An optical window 811 is provided at the sidewall of the process chamber 1. The optical window 811 is made of material transparent enough for wavelengths of lights to accept. The plasma monitor 81 accepts lights emitted from the plasma inside the process chamber 1 through the optical window 811.

Figure 7:
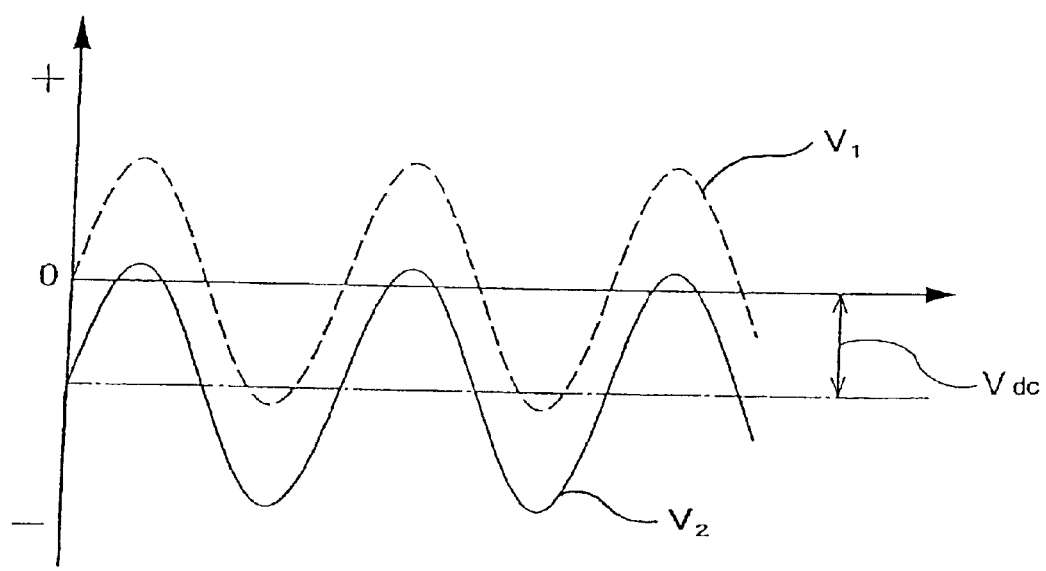
FIG. 7 explains the self-biasing voltage.

The self-biasing-voltage detector 82 detects magnitude of the self-biasing voltage from the potential alternation at the RF electrode 3. FIG. 7 explains the self-biasing voltage. As shown in FIG. 7, when the RF voltage $V_1$ is applied to the RF electrode 3 via capacitance, surface potential at the RF electrode 3 alters as negative DC voltage $V_{dc}$ is superposed on the RF voltage $V_1$, as designated by $V_2$. This $V_{dc}$ is self-biasing voltage.

Generally, self-biasing voltage is automatically generated when RF voltage is applied via capacitance to an object in contact with plasma. Self-biasing voltage is caused by the difference of mobility between electrons and ions in plasma, and negatively biases the object.

The self-biasing-voltage detector 82 calculates the time-averaged value or the peak-to-peak-averaged value of the detected potential alternation at the RF electrode 3. Then, magnitude of the self-biasing voltage is gained by comparing the calculated value with the ground potential. As shown in FIG. 6, the self-biasing-voltage detector 82 detects potential at the inner conductor 421. Potential at this member is practically the same as the RF electrode 3.

Figure 8:
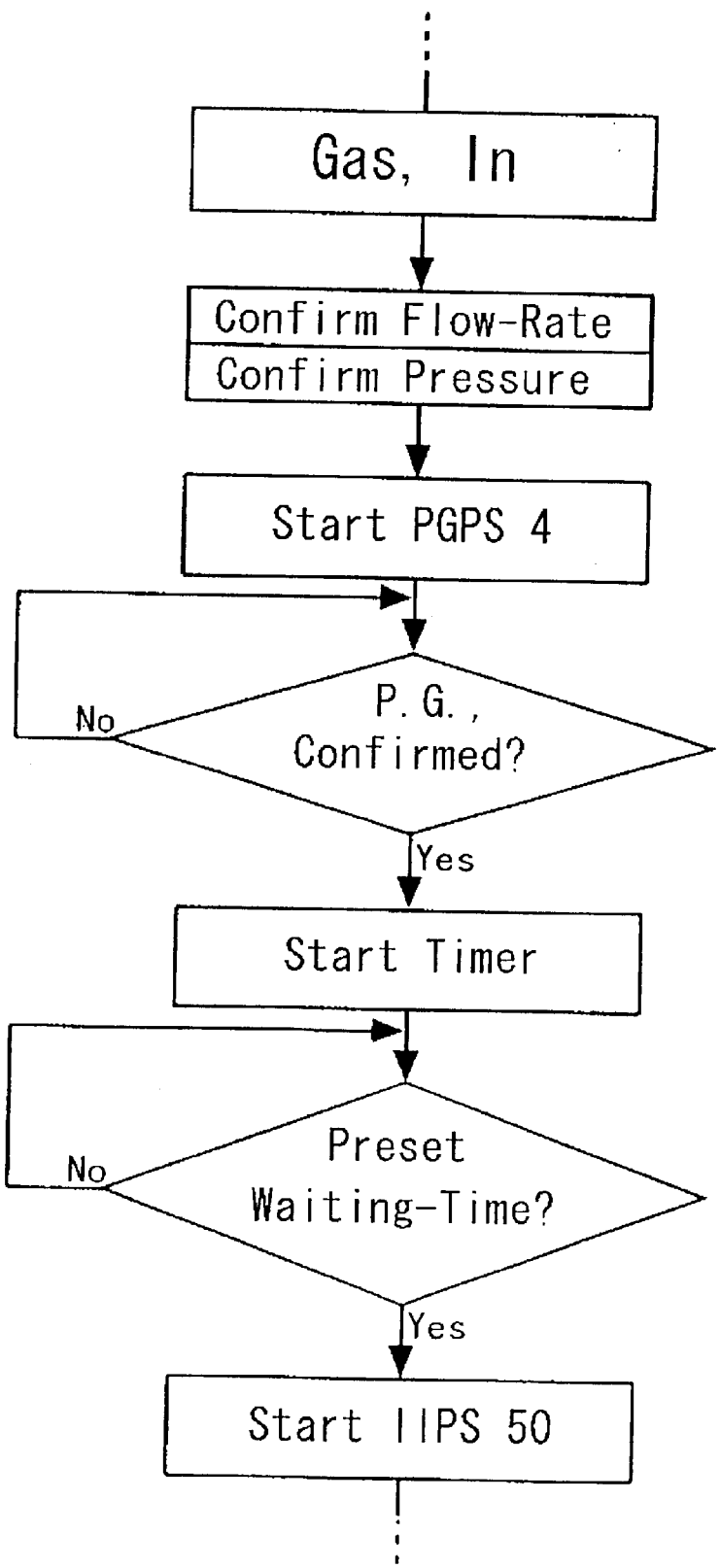
FIG. 8 is the schematic flow-chart of the sequence control program 70 in the second embodiment.
Figure 9:
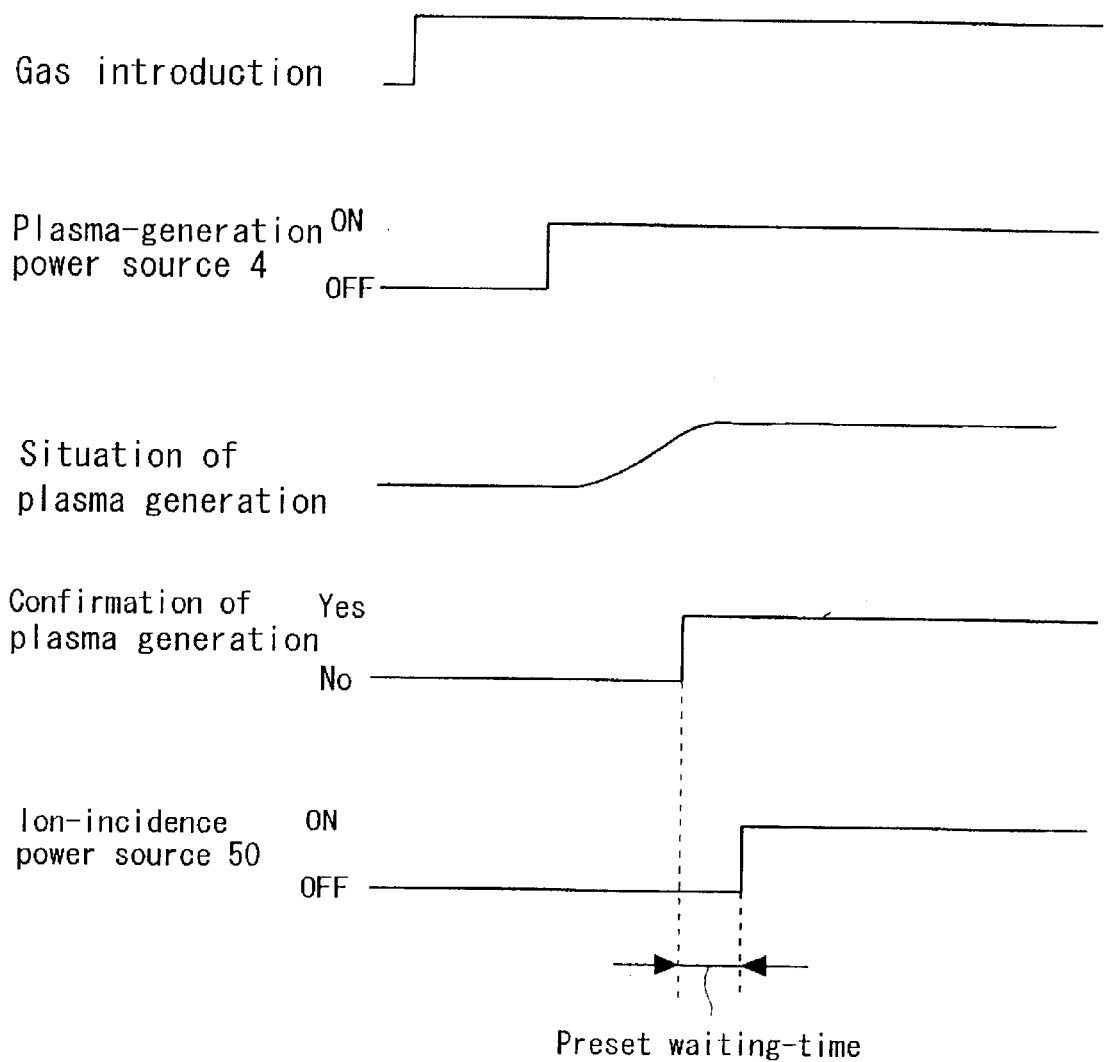
FIG. 9 is the timing chart on operations of the plasma-generation power source 4 and the ion-incidence power source 50 in the sequence control program 70 shown in FIG. 8.

Referring to FIG. 8 and FIG. 9, the sequence control program 70 in the second embodiment will be described. FIG. 8 is the schematic flow-chart of the sequence control program 70 in the second embodiment. FIG. 9 is the timing chart on operations of the plasma-generation power source 4 and the ion-incidence power source 50 in the sequence control program 70 shown in FIG. 8.

The sequence control program 70 starts operation of the plasma-generation power source 4 after confirming that the process gas is introduced at a required flow-rate and that the process chamber is kept at a required vacuum-pressure. At the same time of or prior to starting applying the RF voltage, the sequence control program 70 starts receiving the signals from the plasma monitor 81 and the self-biasing-voltage detector 82.

As described, the RF voltage applied to the RF electrode 3 causes insulation breakdown at the discharge space, igniting the discharge. As the ionization degree rapidly increases, the plasma generation begins. When the plasma density increases to some extent, the sequence control program 70 confirms the plasma generation by the signals from the plasma monitor 81 and the self-biasing-voltage detector 82. As shown in FIG. 8, the sequence control program 70 starts a timer at the moment of confirming the plasma-generation.

When the timer reaches the preset waiting-time, the sequence control program 70 starts operation of the ion-incidence power source 50. As a result, the RF voltage is applied to the substrate holder 5, thereby generating the self-biasing voltage at the substrate 9. The ion-incidence electric field is applied by the self-biasing voltage.

In the second embodiment as well, because the HF power is supplied after enough time for the plasma stabilization has passed, there never happens the accidents that the plasma-generation power source 4 drops down by increase of the reflected wave. In addition, the timer is started when the plasma generation is confirmed after starting operation of the plasma-generation power source 4. Therefore, the system is free from the accident that the ion-incidence power source 50 might be operated by mistake in the state no plasma is generated.

The preset waiting-time in the second embodiment may be any value of zero second or more. That is, operation of the ion-incidence power source 5 may be started at the same time when the plasma generation is confirmed. In the progress the plasma is generated, the signals from the plasma monitor 81 and the self-biasing-voltage detector 82 increase continuingly. Length of the preset waiting-time is adequately determined, considering at how much volume of those signals the plasma can be regarded as "generated". In addition, time from the plasma generation to the plasma stabilization depends on factors such as pressure. Considering such factors, the preset waiting-time is adequately determined.

Figure 10:
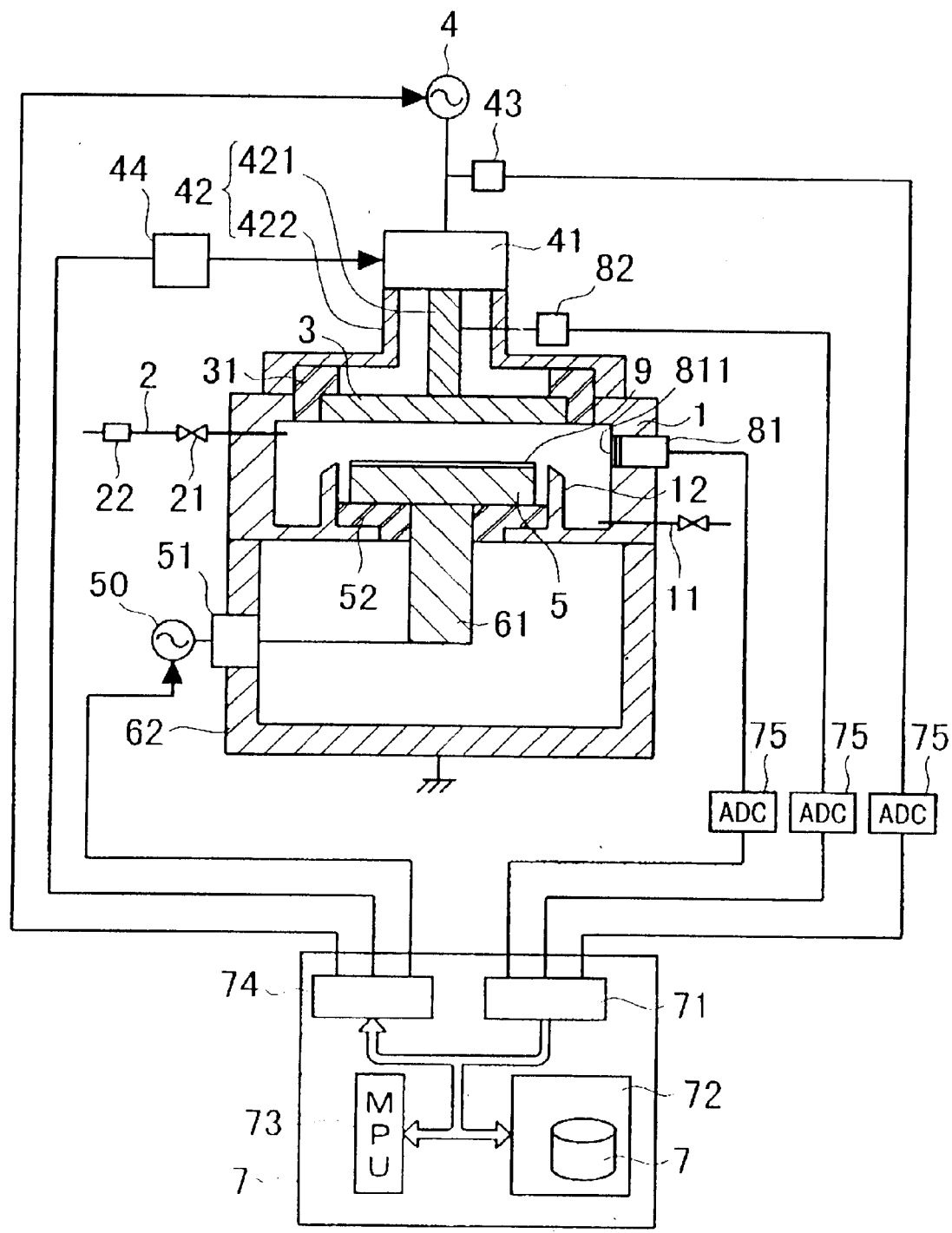
FIG. 10 is the schematic front cross-sectional view of the RF plasma processing system as the third embodiment of the invention.

Next, the third embodiment of this invention will be described. FIG. 10 is the schematic front cross-sectional view of the RF plasma processing system as the third embodiment of the invention. What characterizes the third embodiment is that the system is optimized considering difference of the impedance at the discharge space before and after the plasma generation. Concretely, as shown in FIG. 10, the system of the third embodiment further comprises a matching-element controller 44. For the same purpose, the sequence control program 70 in the controller 7 is further modified.

Figure 11:
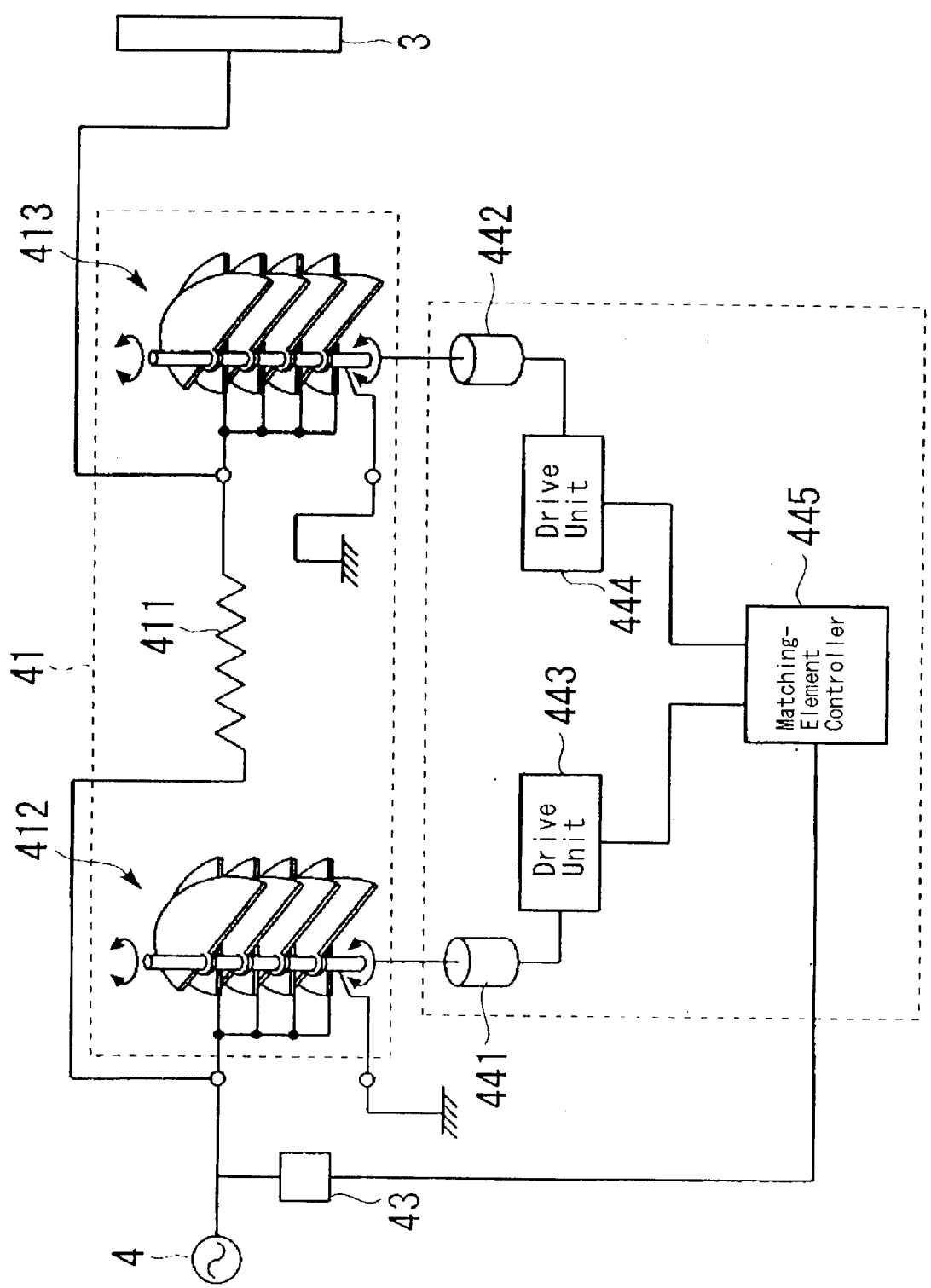
FIG. 11 shows details of the plasma-generation matching element 41 and the matching-element controller 44 provided in the system as the third embodiment.

FIG. 11 shows details of the plasma-generation matching element 41 and the matching-element controller 44 provided in the third embodiment. As shown in FIG. 11, the plasma-generation matching element 41 comprises a resistor 411, a couple of variable capacitors 412, 413 provided between each side of the resistor 41 and the ground. One side is the resistor 411 is to the plasma-generation power source 4, and the other side is to the load, i.e. to the RF electrode 3.

The matching-element controller 44 comprises a couple of motors 441, 442, a couple of drive units 443, 444 for the motors 441, 442, and a control unit 445 to control the drive units 443, 444. Each motor 441, 442 displaces one electrode of each variable capacitor 412, 413 against the other stating electrode for varying each capacitance. As each motor 441, 442, a high-performance servomotor is preferably used.

Figure 12:
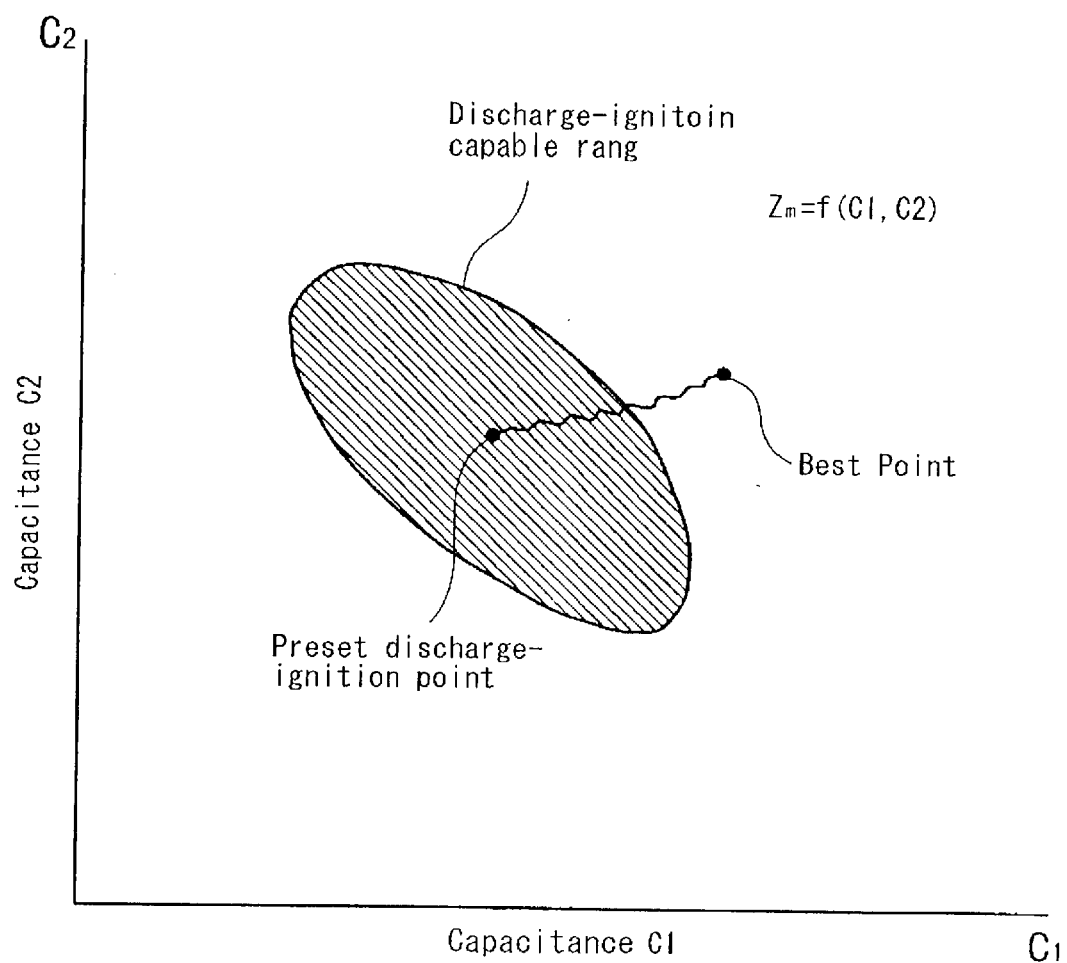
FIG. 12 explains the control of the plasma-generation matching element 41 by the matching-element controller 44 shown in FIG. 10 and FIG. 11.

FIG. 12 explains the control of the plasma-generation matching element 41 by the matching-element controller 44 shown in FIG. 10 and FIG. 11. As known, impedance matching is to match a load-side impedance with the characteristic impedance of a line, thereby preventing reflection of the wave. As shown in FIG. 11, the impedance to the load side from the plasma-generation matching element 41 is coordinated by the variable capacitors 412, 412, which enables the impedance matching in this embodiment. This is because variation of capacitance much more affects whole impedance than variation of resistance in a system using an RF wave as in this invention. Varying capacitance is much more efficient than varying resistance.

Impedance of the plasma-generation matching element 41 is the one to be provided for the impedance matching in applying the RF wave of the first frequency to the RF electrode 3. This impedance in hereinafter called "the matching impedance $Z_m$". In the structure of the plasma-generation matching element 41, the matching impedance $Z_m$ is the function of the capacitances of the variable capacitors 412, 413. Where the capacitances are C1 and C2 as in FIG. 12, the matching impedance $Z_m$ is expressed as $Z_m = f(C1, C2)$ In generating plasma by an RF gaseous discharge as in this invention, what attention should be paid to is the point that impedance at discharge space as a load changes before and after ignition of the discharge. Before ignition of the discharge, the discharge space is insulator having high impedance, though a gas is introduced. Contrarily, after plasma is generated by the discharge, impedance at the discharge space decreases because plasma as a population corresponds to conductor. In the state plasma is generated, the space impedance greatly depends on the sheath capacitance. After all, the impedance matching should be considered, distinguishing the fore-discharge-ignition and the post-discharge-ignition.

Here is considered impedance matching condition necessary for igniting a discharge. Impedance matching condition necessary for igniting a discharge is one necessary for causing insulation breakdown at discharge space. This condition is comparatively broad. The range for satisfying the condition necessary for igniting discharge, which is hereinafter called "discharge-ignition capable range", in this embodiment is shown in FIG. 12 by hatching. The range designated by the hatching in FIG. 12 is the range of the matching impedance ZM that is the function of the capacitances C1 and C2. The discharge-ignition capable range tends to be broader when pressure at the discharge space increases.

On the other hand, impedance matching after ignition of a discharge is to retain the plasma efficiently. The ideal state is that proportion of the RF power coupled with the plasma is maximized, minimizing reflection. The impedance matching condition establishing such the ideal state is very narrow, which could be called "pin-point condition". This condition is hereinafter called "the best point".

Though the best-point impedance matching condition might be within the discharge-ignition capable range by chance, it is out of the range in many cases. Therefore, it is most preferable to switch impedance matching condition to the best point after igniting a discharge as impedance matching is performed within the discharge-ignition capable range. Realizing this idea, the matching-element controller 44 initially performs impedance matching where the matching impedance $Z_m$, which is expressed as $z=f(C1, C2)$, is within the discharge-ignition capable range, and then switches to the best point. The initial value of the matching impedance $Z_m$ within the discharge-ignition capable range is hereinafter called "preset discharge-ignition point".

In this embodiment, the preset discharge-ignition point is experimentally determined in advance. Concretely, as keeping the process chamber 1 at a vacuum pressure of about 4 Pa without producing the process-gas, the RF power is supplied to the RF electrode 3 at the same level as in the actual process. Though no discharge is ignited in this case, the reflected wave from the RF electrode 3 is varied when the matching impedance $Z_m$ is varied by driving the variable capacitors 412, 413. Memorizing the values of capacitances C1, C2 where the reflected wave from the RF electrode 3 is minimized, the value of the matching impedance $Z_m$ gained from the memorized values C1, C2 is determined as the preset discharge-ignition point. The controller 7 also memorizes the determined preset discharge-ignition point.

In this embodiment, impedance matching at the best point is performed according to the signal from the power-supply monitor 43. Receiving the signal from the power-supply monitor 43, the control unit 445 controls the drive units 443, 444 so that ratio of the reflected wave against the progressive wave can be minimized.

This control is described more concretely, letting the variable capacitor 412 be the first capacitor, the motor 441 for this be the first motor, the variable capacitor 413 be the second capacitor, and the motor 442 for this be the second motor. At the first and second capacitors 412, 413, the driving directions where the capacitances increase are "plus", and the driving directions where the capacitances decrease are "minus".

The control unit 445 sends the signal to the drive unit 443 so that the first capacitor 412 can be driven to, for example, the plus direction. Meanwhile, if the reflected wave increases, the control unit 445 drives the first capacitor 412 inversely to the minus direction. In the same way, when the decreasing reflected-wave turns to increasing, passing the minimum value, the first capacitor 412 is driven to the opposite direction. The first motor 441, which is the servomotor, submits the negative-feedback control so that the reflected wave can be minimized. The second motor 442 for the second capacitor 413 is controlled in the same way so that the reflected wave can be minimized.

A locus in FIG. 12 designates how C1 and C2 transit as a result of the control by the matching-element controller 44. As shown in FIG. 12, C1 and C2 initially correspond with the preset discharge-ignition point when the discharge is ignited. After the discharge ignition, the automatic negative-feedback control is performed by the signal from the power-supply monitor 43, making C1 and C2 change unstably. When the plasma is stabilized, C1 and C2 also transit to be stable values corresponding with the best point. In the state the plasma is stabilized, driving volumes of the capacitors 412, 413, i.e. rotation angles of the motors 441, 442, are minimized. The matching-element controller 44 outputs driving volumes of the capacitors 412, 413 to the controller 7 all the time. When it is confirmed that the driving volumes decrease blow a preset value, the controller 7 judges the plasma is stabilized.

The best point, which is the point that the matching impedance $Z_m$ settles at in the automatic control, is not always the same. It may change in every process. This happens in case the process condition, e.g. pressure in the process chamber 1 and kind of the process gas, is changed. In addition to this, it happens in case that deposition takes places on the interior wall of the process chamber 1. The matching-element controller 44 controls the plasma-generation matching element 41, pursuing the best point in any situation.

Figure 13:
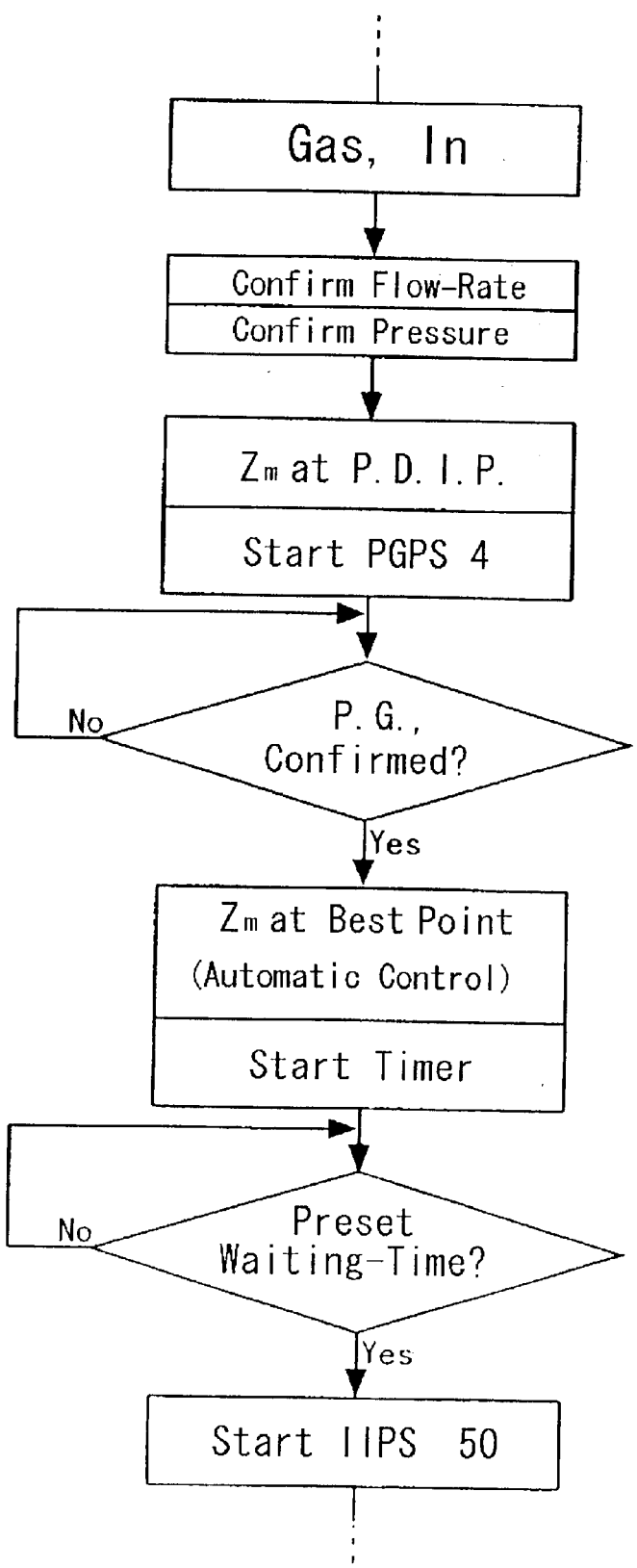
FIG. 13 is the schematic flow-chart of the sequence control program 70 in the third embodiment.
Figure 14:
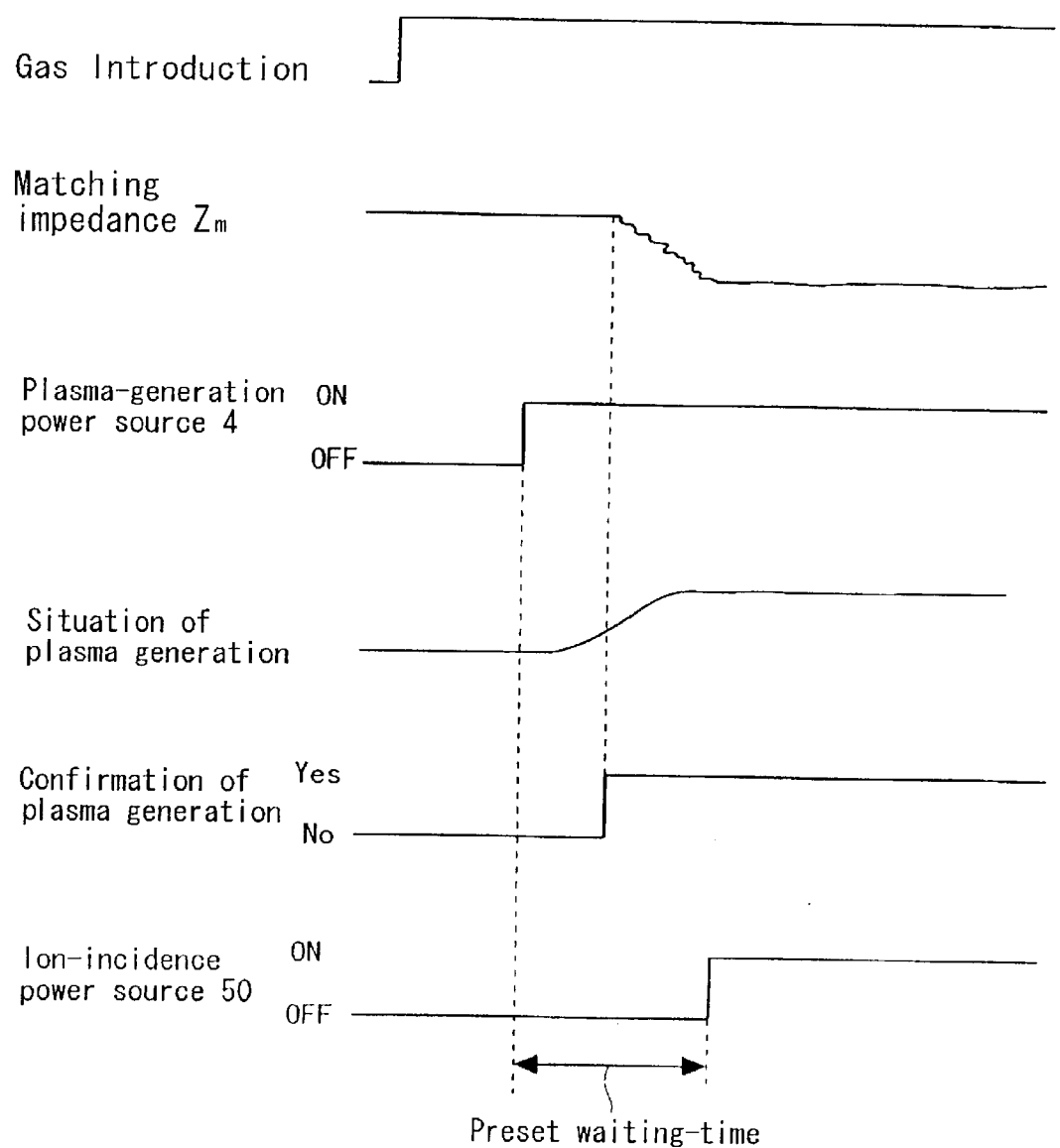
FIG. 14 is the timing chart on operations of the plasma-generation power source 4 and the ion-incidence power source 50 in the sequence control program 70 shown in FIG. 13.

Referring to FIG. 13 and FIG. 14, the sequence control program 70 in this embodiment will be described as follows. FIG. 13 is the schematic flow-chart of the sequence control program 70 in the third embodiment. FIG. 14 is the timing chart on operations of the plasma-generation power source 4 and ion-incidence power source 50 in the sequence control program 70 shown in FIG. 13. In FIG. 14, the part "matching impedance $Z_m$" schematically shows transition of the matching impedance $Z_m$ as an example.

As well as the described embodiments, the sequence control program 70 starts operation of the plasma-generation power source 4 after confirming that the process gas is introduced at a required flow-rate and the process chamber is kept at a required vacuum pressure. The sequence control program 70 has sent the signal in advance to the matching-element controller 44 so that the impedance matching can be performed at the preset discharge-ignition point. The matching-element controller 44 has made the drive units 443, 444 drive the variable capacitors 412, 413 for the preset discharge-ignition point in advance.

When the RF voltage is applied to the RF electrode 3 by the plasma-generation power source 4, insulation breakdown takes place at the discharge space to ignite the discharge, thereby generating the plasma. At the same time of or prior to the RF voltage supply initiation, the sequence control program 70 has started receiving the signals from the plasma monitor 81 and the self-biasing-voltage detector 82.

After confirming the plasma generation by one of or both of the signals from the plasma monitor 81 and the self-biasing-voltage detector 82, the sequence control program 70 sends a signal to the matching-element controller 44 to switch the impedance matching control. As a result, the control by the matching-element controller 44 is switched to the automatic control for the best point. Simultaneously, the controller starts a timer.

The matching-element controller 44 drives the variable capacitors 412, 413, according to the signal from the power-supply monitor 43, thereby carrying out the automatic negative-feedback control for the best point. When the timer reaches the preset waiting-time, the sequence control program 70 starts operation of the ion-incidence power source 50. As a result, the RF voltage is applied to the substrate holder 50, thereby generating the self-biasing voltage at the substrate 9. The electric field for the ion incidence is applied by this voltage.

In this embodiment, the discharge is ignited as the impedance matching control is performed at the preset discharge-ignition point, and the automatic control for the impedance matching for the best point is performed after confirming the plasma generation. Therefore, the optimum impedance matching is secured at the time of the discharge ignition and after the plasma generation. Therefore, both at the time of the discharge ignition and at the post-plasma-generation, the reflected wave is minimized, which enhances the power efficiency for the discharge ignition and the plasma retention.

In the third embodiment, it is not always necessary to perform the automatic control pursuing the best point for the stable plasma retention. For example, it is also practical to preset the optimum value of the matching impedance $Z_m$ for the stable plasma retention, and switch from the preset discharge-ignition point to the preset value after confirming the plasma generation.

The switch from the preset discharge-ignition point to the best point was at the same time the plasma generation is confirmed, it occasionally may be preferable to put a time-lag. In case the discharge is ignited at a low pressure not higher than 3 Pa, it takes a little longer time for the plasma to transit to a stable state after the discharge is ignited. This time does not exceed three seconds at the longest. Therefore, it is preferable to switch to the best point when about six seconds, including a safety margin, has passed after the RF voltage is applied to the RF electrode 3. Also in this case, operation of the ion-incidence power source 50 is started when about two seconds has passed after switching to the best point.

In the third embodiment, it is further preferable to gradually increase the output of the ion-incidence power source 50 up to a preset level optimized for the process onto the substrate 9. Specifically, the output power is gradually increased in 0.5 to 6 seconds up to the preset optimum level. If the output level is rapidly increased, it greatly changes condition of the discharge space and the state of the plasma. In this case, it might happen that the automatic control of the plasma-generation matching element 41 cannot follow such the changes, making output of the ion-incidence power source 50 drop down by the inter-lock, i.e. the emergent output stop for the self protection. For preventing such the accident, the output is preferably increased up to the preset optimum level in half a second or more. If this time is over six seconds, it matters in view of productivity. Therefore, it is preferable not longer than six seconds.

Figure 15:
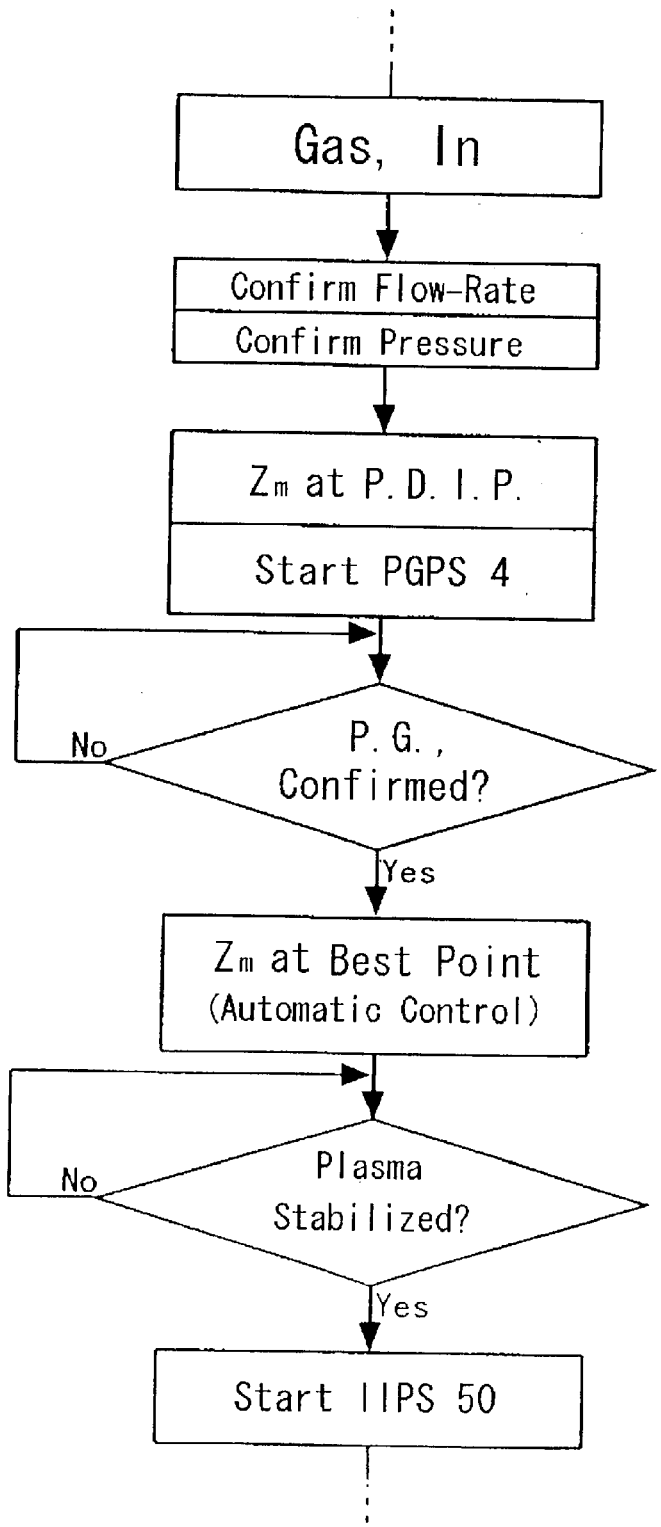
FIG. 15 is the schematic flow-chart of the sequence control program 70 in the fourth embodiment.
Figure 16:
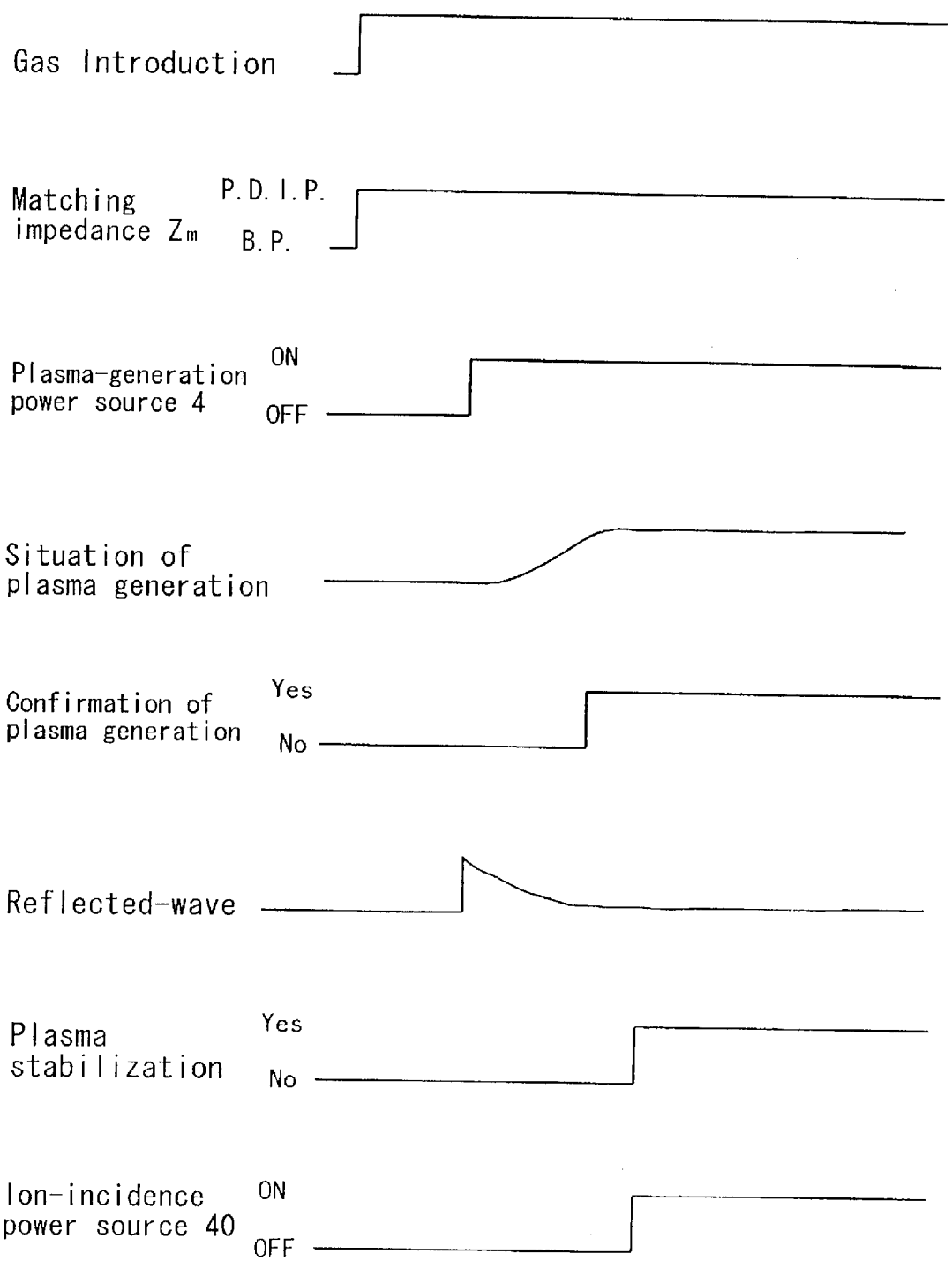
FIG. 16 is the timing chart on operations of the plasma-generation power source 4 and the ion-incidence power source 50 in the sequence control program 70 shown in FIG. 15.

Next, the fourth embodiment of the invention will be described. The fourth embodiment differs in the sequence control program 70 from the described third embodiment. The rest of the parts are essentially the same. FIG. 15 is the schematic flow-chart of the sequence control program 70 in the fourth embodiment. FIG. 16 is the timing chart on operations of the plasma-generation power source 4 and the ion-incidence power source 50 in the sequence control program 70 shown in FIG. 15.

The point greatly characterizing the fourth embodiment is that operation of the ion-incident power source 50 is started after confirming stabilization of the plasma by the signal from the power-supply monitor 43. Concretely, as well as in the third embodiment, the plasma is generated by the plasma-generation power source 4 operated as the impedance matching control is performed at the preset discharge-ignition point. The power-supply monitor 43 measures proportion of the reflected wave against the progressive wave, and sends it to the controller 7 via the AD converter 75. The sequence control program 7 switches the control to the automatic control for the best point after confirming the plasma generation. In the progress of the automatic control, the plasma transits to a stable state.

In the progress the plasma transits to stable state, the reflected wave gradually decreases as shown in FIG. 16. The sequence control program 70 judges whether the reflected wave has settled at a level lower than a preset reference level. If the true vale is returned, it means the plasma is judged to have transited to a stable state. At this timing, the sequence control program 70 starts operation of the ion-incidence power source 50 for applying the ion-incidence electric field.

The system of this embodiment is free from the accident that the ion-incidence power source 50 might be operated by mistake in the situation the plasma has not transited to a stable state, because the ion-incident power source 50 is operated after confirming the plasma stabilization. As for the preset reference level of the reflected wave, it can be, for example, twenty percent against the progressive wave.

Figure 17:
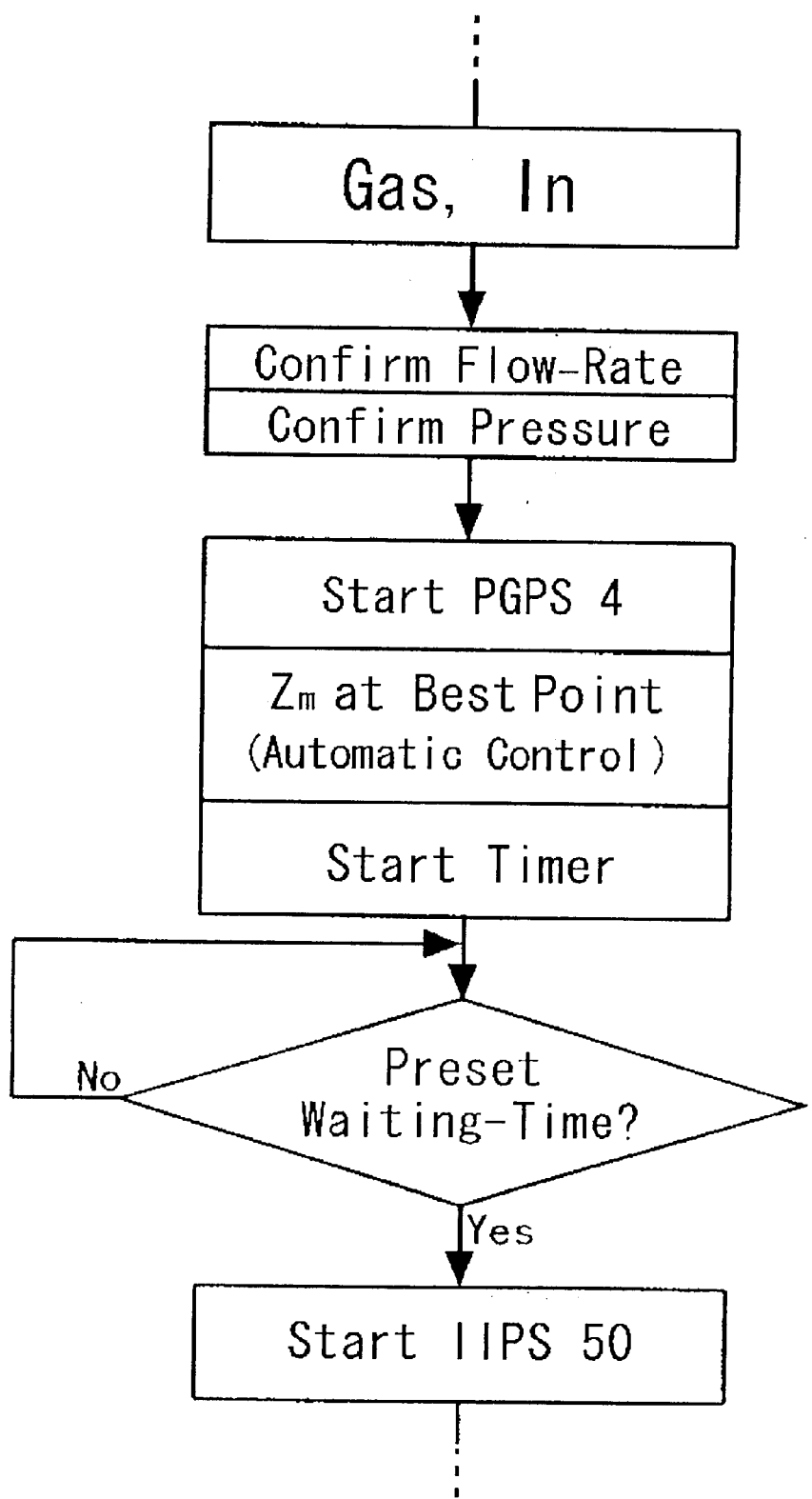
FIG. 17 is the schematic flow-chart of the sequence control program 70 in the fifth embodiment.
Figure 18:
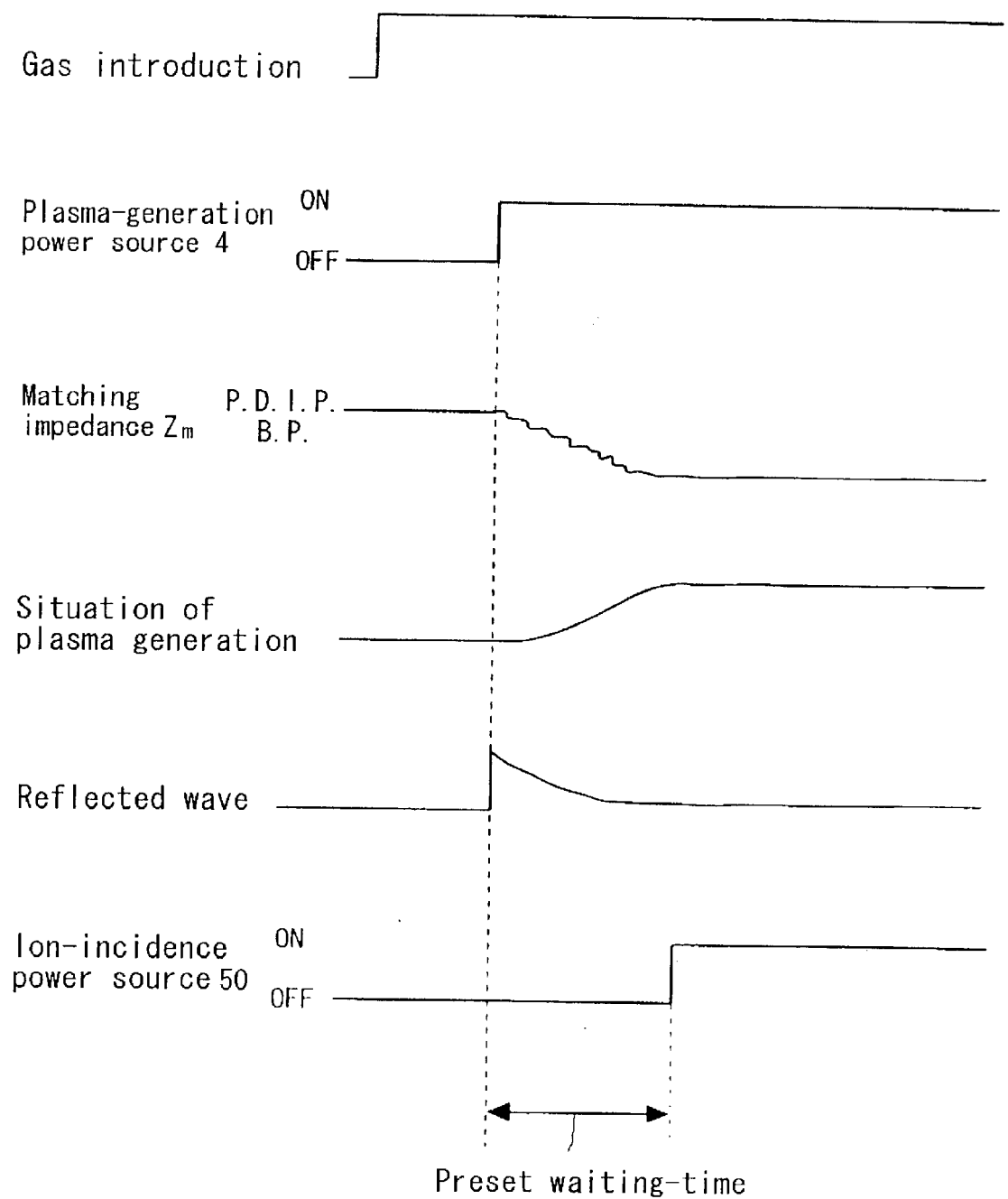
FIG. 18 is the timing chart on operations of the plasma-generation power source 4 and the ion-incidence power source 50 in the sequence control program 70 shown in FIG. 17.

Next, the fifth embodiment of the invention will be described. The fifth embodiment also differs in the sequence control program 70 from the described embodiments. Other parts are essentially the same. FIG. 17 is the schematic flow-chart of the sequence control program 70 in the fifth embodiment. FIG. 18 is the timing chart on operations of the plasma-generation power source 4 and the ion-incidence power source 50 in the sequence control program 70 shown in FIG. 17.

Making the matching-element controller 44 perform the impedance matching control at the preset discharge-ignition point in advance, the sequence control program 70 in the fifth embodiment starts operation of the plasma-generation power source 4, thus igniting the discharge. At the moment operation of the plasma-generation power source 4 is started, the sequence control program 70 switches the control to the automatic control for the best point. Also at the moment operation of the plasma-generation power source 4 is started, a timer is started.

As degree of the gaseous ionization increases after the discharge ignition, the reflected wave decreases gradually. Following this, the matching-element controller 44 varies the capacitances of the variable capacitor 412, 413, the matching impedance $Z_m$ changes unstably. Afterward, when the plasma is stabilized, the reflected wave settles at a stable low level. The matching impedance $Z_m$ also settles at a stable point.

In this embodiment, the preset waiting-time is longer enough than the time for the plasma to be stabilized. When the timer reaches the preset waiting-time, the sequence control program 70 starts operation of the ion-incidence power source 50, applying the electric field for ion-incidence. This embodiment has the merit that a means for confirming the plasma generation is not required, which simplifies the system.

In this embodiment as well, the plasma stabilization may be confirmed not by the signal from the power-supply monitor 43 but by the signal from the matching-element controller 44. When the plasma is stabilized, driving volume of the variable capacitors 412, 413 decreases to almost zero. Therefore, the plasma stabilization can be confirmed by monitoring driving volume of the variable capacitors 412, 413.

Figure 19:
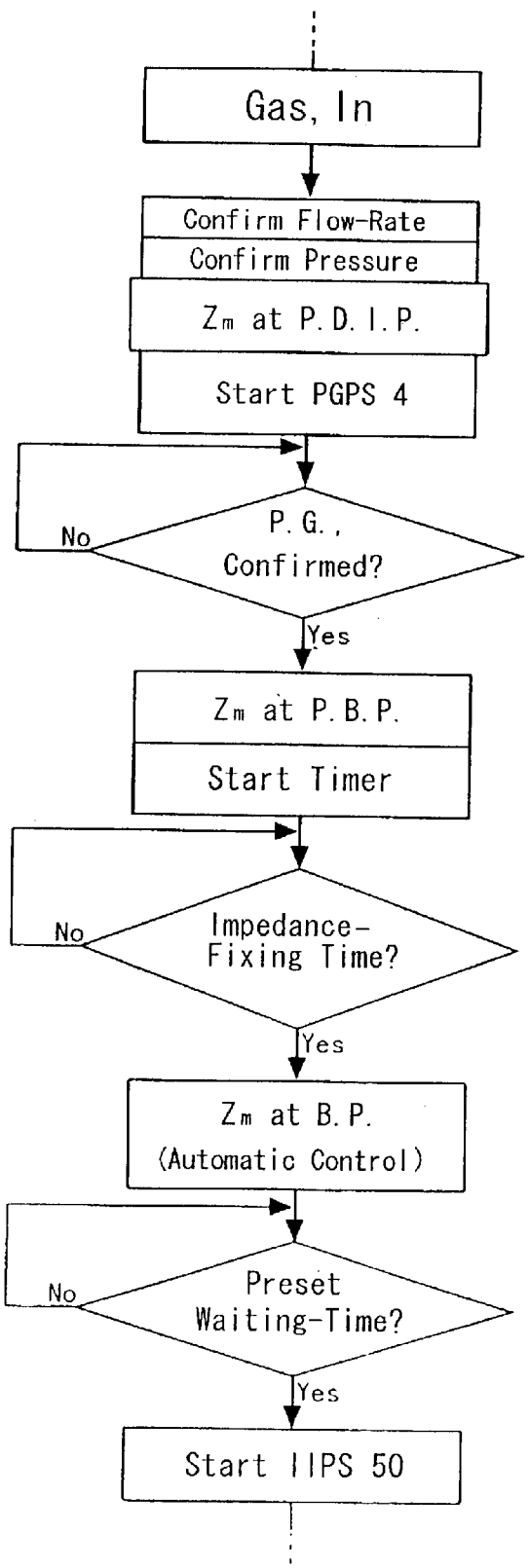
FIG. 19 is the schematic flow-chart of the sequence control program 70 in the sixth embodiment.
Figure 20:
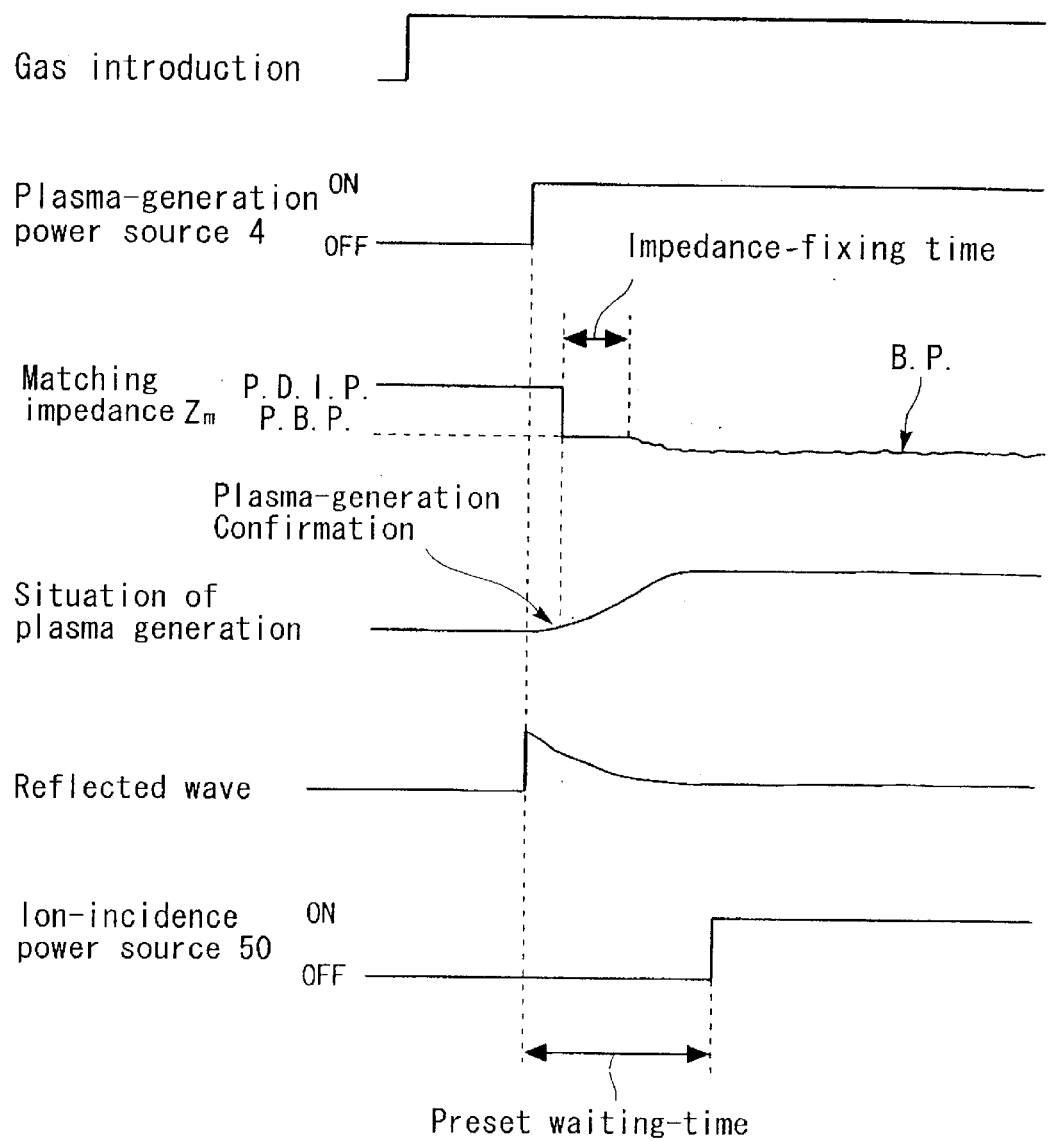
FIG. 20 is the timing chart on operations of the plasma-generation power source 4 and the ion-incidence power source 50 in the sequence control program 70 shown in FIG. 19.

Next, the sixth embodiment of the invention will be described. The sixth embodiment also differs in the sequence control program 70 in the controller 7 from the described embodiments. Other parts are essentially the same. FIG. 19 is the schematic flow-chart of the sequence control program 70 in the sixth embodiment. FIG. 20 is the timing chart on operations of the plasma-generation power source 4 and the ion-incidence power source 50 in the sequence control program 70 shown in FIG. 19.

The sequence control program 70 in this embodiment as well starts operation of the plasma-generation power source 4 as the impedance matching control is performed at the preset discharge-ignition point. The power-supply monitor 43 measures proportion of the reflected wave against the progressive wave and send it to the controller 7 via the AD converter 75. After confirming the plasma generation according to the signal from a plasma-generation confirmation means, the sequence control program switches the impedance matching control to the one at the preset best point, and a timer is started. The sequence control program 70 fixes the matching impedance $Z_m$ at the preset best point for a preset time. When the timer reach the preset time, the sequence control program 70 switches the impedance matching control to the automatic control for the best point. Operation of the ion-incidence power source 50 is started when the time for stabilizing the automatic control has passed, as in the third embodiment. The preset time through which the matching impedance $Z_m$ is fixed at the preset best point is hereinafter called "the preset impedance-fixing time".

This embodiment has the advantage of streamlining the switch of the control from the one at the preset discharge-ignition point to the automatic control. In the described third embodiment, after the sequence control program 70 switches the control from the one at the preset discharge-ignition point to the automatic control, the matching-element controller 44 automatically coordinates the matching impedance $Z_m$ so that the reflected wave can be minimized. As a result, the power coupled with the plasma is increased, upgrading the ionization degree. Accompanied by this, impedance of the plasma is changed. The controller 7 performs the automatic control, following the impedance change at the plasma. When almost all gas molecules are ionized, the plasma is stabilized, and the automatic control secures the best point. The power coupled with the plasma is also stabilized, and the matching impedance $Z_m$ settles at a stable value.

However, in case volume of the reflected wave is some large at the moment just after the automatic control is started, the automatic control would target a state largely deviating from the ideal state. Concretely, in case there is comparatively large difference between the preset discharge-ignition point ant the best point, the reflected wave of some large volume sometimes exists when the automatic control is started. Even in this case, the matching impedance $Z_m$ is expected to settle at the best point by the automatic control. However, if the reflected wave of an excessive volume exists in starting the automatic control, output of the plasma-generation power source 4 sometimes drops down because the self-protection circuit works before the matching impedance $Z_m$ settles at the best point.

If this happens, level of the power coupled with the plasma is much changed, resulting in that the factors of the plasma, e.g. thickness of the plasma sheath, the plasma potential and the plasma density, are much changed as well. Then, in such the much-changed state, the automatic control is continued pursuing the best point. As a result, the automatic control would target a state largely deviating from the ideal one. That is, the automatic control would match the matching impedance $Z_m$ with the best point in a state that the power-level is much low. Therefore, even if the whole impedance is matched with the characteristic impedance, it would be far from the expected normal state, for example, being the sate of much-lower plasma-density.

Contrarily, the sixth embodiment performs the control to fix the matching impedance $Z_m$ at the preset best point for the preset impedance-fixing time, before switching the control to the automatic control. The preset best point is determined experimentally or theoretically in advance. Concretely, according to parameters such as pressure, flow rate of the process gas and the voltage to apply, it is presumed the value of the best point at which the matching impedance $Z_m$ would reach in the actual automatic control. Then, the presumed value is determined as the preset best point. While the matching impedance $Z_m$ is fixed at the preset best point, the plasma transits to a state close to the stable state, for example, the state where the ionization is almost saturated. Accordingly, the automatic control is started from the state where the reflected wave is much smaller than the described third embodiment. Therefore, the automatic control is never performed targeting a state deviating from the ideal state. This enables the process to be carried out under the normal condition all the time. From these points, the system of this embodiment is superior in reproducibility and reliability. This advantage is not limited to the case that the initial impedance matching control is performed at the preset discharge-ignition point. It is brought broadly to systems and methods where the automatic control is performed for the best point. In the sixth embodiment, the preset impedance-fixing time is preferably 0.5 to 5 seconds, for example, may be about 1 second.

Figure 21:
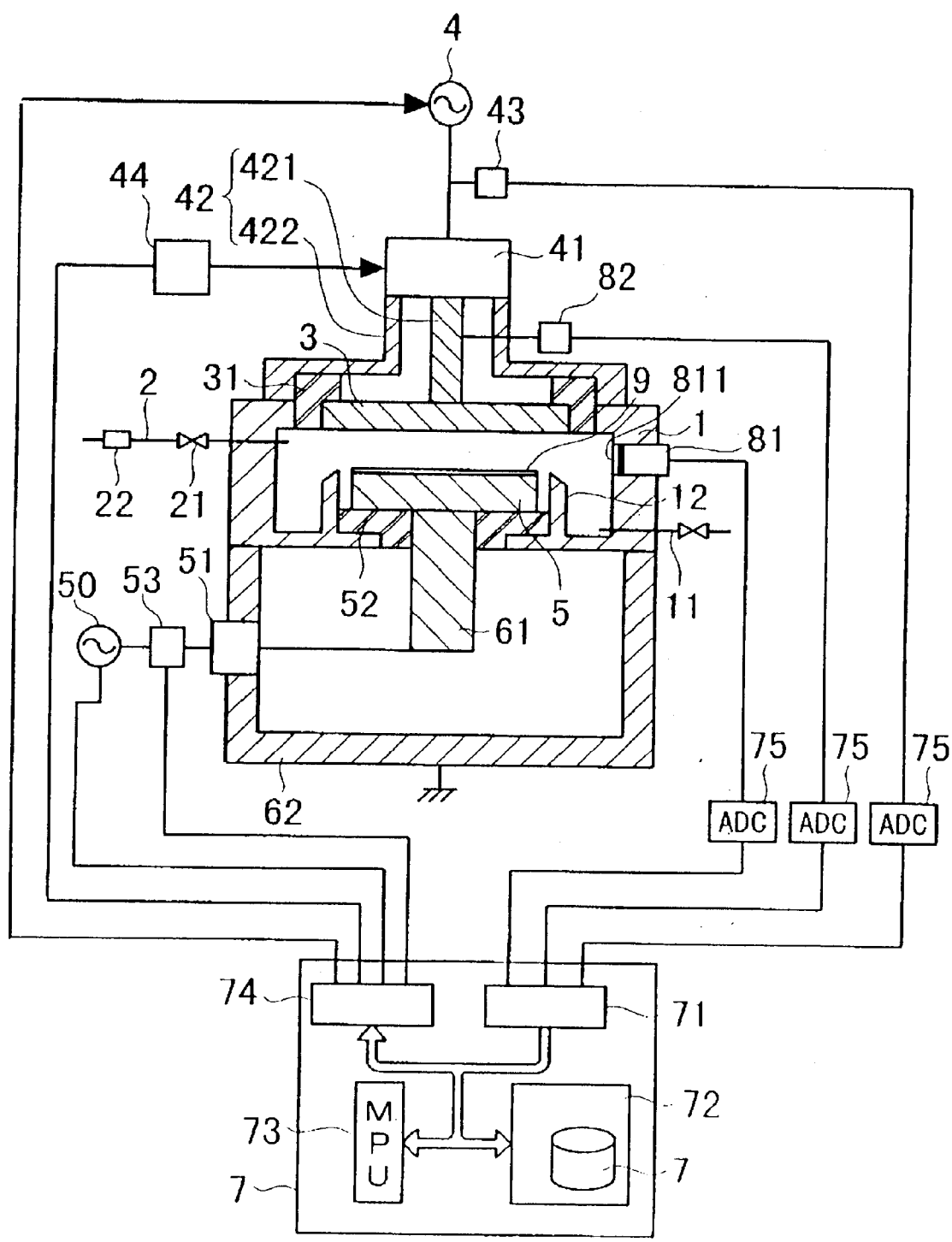
FIG. 21 is the schematic front cross-sectional view of the RF plasma processing system as the seventh embodiment of the invention.
Figure 22:
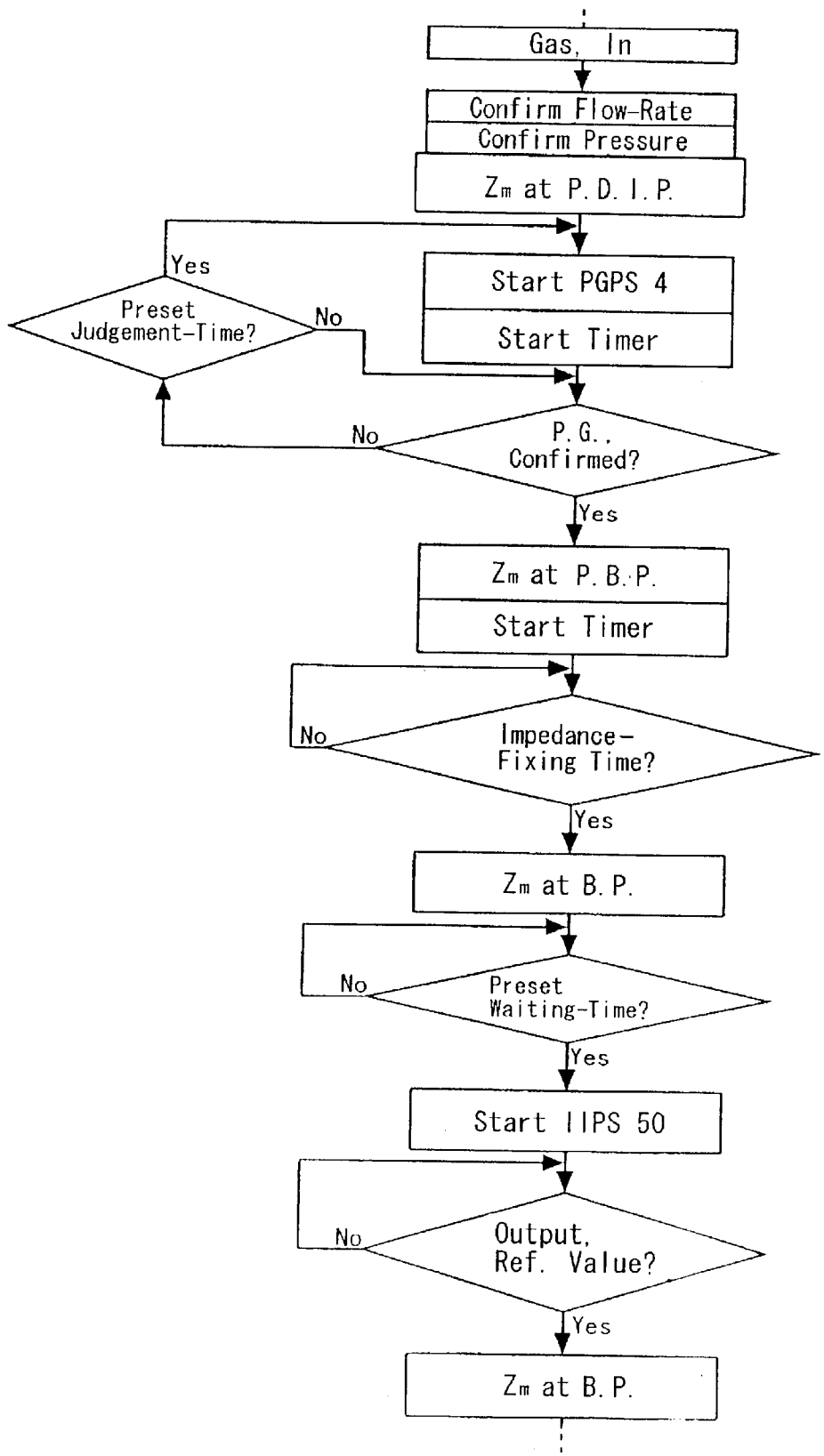
FIG. 22 is the schematic flow-chart of the sequence control program 70 in the seventh embodiment.
Figure 23:
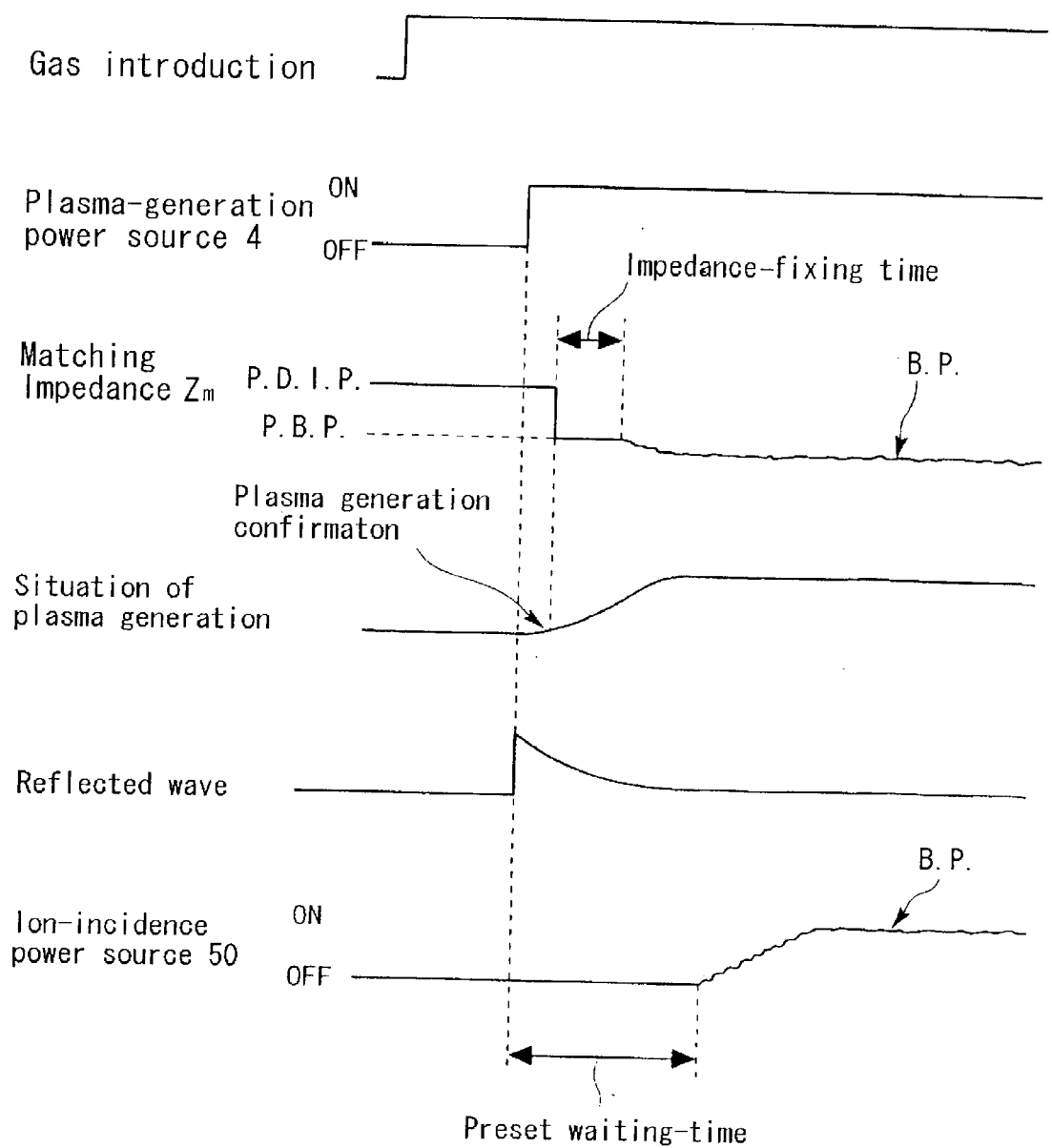
FIG. 23 is the timing chart on operations of the plasma-generation power source 4 and the ion-incidence power source 50 in the sequence control program 70 shown in FIG. 22.

Next, the seventh embodiment of this invention will be described. The system of the seventh embodiment also differs in the sequence control program 70 from the described embodiments. Other parts are essentially the same. FIG. 21 is the schematic front cross-sectional view of the RF plasma processing system as the seventh embodiment of the invention. FIG. 22 is the schematic flow-chart of the sequence control program 70 in the seventh embodiment. FIG. 23 is the timing chart on operations of the plasma-generation power source 4 and the ion-incidence power source 50 in the sequence control program 70 shown in FIG. 22.

The seventh embodiment differs in two following points from the described embodiments. One is that the sequence control program 70 resets itself in the case the plasma generation has not been confirmed after starting operation of the plasma-generation power source 4. The other one is that the output-power control of the ion-incidence power source 50 is optimized as well as the plasma-generation power source 4.

Concretely, as shown in FIG. 21, the system of this embodiment comprises another matching-element controller 53 for controlling the ion-incidence matching element 51. The controller 7 is capable of controlling this matching-element controller 53. The matching-element controller 53 comprises a power-supply monitor (not shown) that monitors volume of the reflected wave from the substrate holder 5 against the progressive wave. The matching-element controller 53 is capable of the automatic negative-feedback control for minimizing relative volume of the reflected wave against the progressive wave.

As shown in FIG. 22, in the seventh embodiment as well, the sequence control program 70 starts operation of the plasma-generation power source 4 at the preset discharge-ignition point. At the same time, a timer is started. The power-supply monitor 43 measures proportion of the reflected wave against the progressive wave, and sends it to the controller 7 via the AD converter 75

If the plasma generation is not confirmed by the signal from the plasma-generation confirmation means by the time the timer reaches a preset judgment-time, the sequence control program 70 suspends operation of the plasma-generation power source 4 and resets the timer to zero. Then, returning to the initial step, the program 70 starts operation of the plasma-generation power source 4 again.

In case the plasma generation is confirmed by the signal from the plasma-generation confirmation means by time the timer reaches the preset judgment-time, the sequence control program 70 switches the matching impedance $Z_m$ to the preset best point. At the same time, the sequence control program 70 resets the timer to zero and restarts it. Fixing the matching impedance $Z_m$ at the preset best point, the sequence control program 70 switches the control to the automatic control when the timer reaches the preset impedance-fixing time. As well as in the third embodiment, the sequence control program 70 starts operation of the ion-incidence power source 50 after the time for stabilizing the automatic control has passed.

As shown in FIG. 23, output of the ion-incidence power source 50 is gradually increased up to the level required for the ion-incidence. For example, in case frequency of the ion-incidence power source 50 is 1.6 MHz in the HF band and the required level of the output power is 1.8 kW, the output is gradually increased from 0 up to 1.8 kW in about one second. Initially in this gradual supply of the power, the matching-element controller 53 holds impedance of the ion-incidence matching element 51 at a fixed value.

As shown in FIG. 22, when output of the ion-incidence power source 50 reaches a reference value, the sequence control program 70 sends a signal to the matching-element controller 53 to switch the control to the automatic control that is the same as the automatic control of the plasma-generation matching element 41. The reference value is some small value. For example, it is 10W in case the ultimate required power is 1.8 kW. As a result of that control of the ion-incidence matching element 51 is switched to the automatic control, reflection of the wave applied to the substrate holder 5 from the ion-incidence power source 50 is minimized. Holding this state, output of the ion-incidence power source 50 is gradually increased up to the ultimate required level, and then kept at the level.

This embodiment has the following advantages. First, because the program 70 resets itself to return the initial step in the case the plasma has not been generated within the preset judgment-time, this embodiment is free from the accident that operation of the plasma generation power source 4 might be continued even in the case the plasma generation has not been confirmed by chance. It is further preferable to count the number of resetting. When the counted resetting number reaches a preset value, e.g. three times, execution of the program 70 is completely stopped, and an error signal is output.

The point that output of the ion-incidence power source 50 is gradually increased brings the extraordinary advantage relating to the automatic control of the plasma-generation power source 4. That is, if output of the ion-incidence power source 50 is increased rapidly up to the ultimate required level while the automatic control of the plasma-generation power source 4 is performed, it brings the fear that the automatic control of the plasma-generation power source 4 becomes unstable because parameters at the discharge space are rapidly changed. The matching impedance $Z_m$ is intensely fluctuated, and then settles at a stable value because the automatic control is continuingly performed. However, if parameters of the discharge space are changed much rapidly, the matching-element controller 44 could no longer follow such the changes, resulting in that the matching impedance $Z_m$ does not transit to a stable value forever.

This embodiment, contrarily, is free from such the fear, because output of the ion-incidence power source 50 is gradually increased. The matching impedance $Z_m$ transits to another stable value in a short period. As understood from the above description, "to gradually increase output of the ion-incidence power source 50" means that output of the ion-incidence power source 50 is increased as far as the matching-element controller 4 is capable of following the changes of parameters at the discharge space. In this embodiment, to increase gradually output of the ion-incidence power source 50 is equivalent to increasing gradually the effective input-power to the plasma.

In the described third to seventh embodiments, the initial matching impedance $Z_m$ was at the preset discharge-ignition point when the automatic control for the best point is started. It is still practical to hold the value of the matching impedance $Z_m$ at the end in the last-time process by a holding circuit, and use it as the preset initial value. Unless there is any major change in the environment in the process chamber 1 at each interval of the process, the value of the matching impedance $Z_m$ required to be provided would not change much. This modification is preferable in case that the preset discharge-ignition point differs not so much from the best point. In this modification, the held value of the matching impedance $Z_m$ may be memorized at the memory or storage 72. The sequence control program 70 comprises a step for staring the automatic control in the next process, providing the matching impedance $Z_m$ of the held value.

In each embodiment, the preset waiting-time, which is required for stabilizing the plasma, was two second. Still, it could be longer. Time for stabilizing the plasma depends on factors such as structure of the process chamber, size of the discharge space, pressure in the process chamber, and the like. Therefore, the preset waiting-time is adequately determined taking these factors into consideration.

In this invention, the described automatic control is not always required for the impedance matching to retain the plasma stably. For example, it is also practical to experimentally determine in advance a value of the matching impedance $Z_m$ and preset it. The impedance matching control may be performed fixing the matching impedance $Z_m$ at the preset value for the stable plasma retention. It is further practical to switch the control to the automatic control for the best point after fixing the matching impedance $Z_m$ at the preset value for the stable plasma retention for a preset time.

In each embodiment, the multiple AD converters may be put together into one. Concretely, multiple data may be digitized at one AD converter by time-sharing. In the described embodiments, the first frequency was in the VHF band, and the second frequency was in the HF band. The invention is not limited to this case. Modulation phenomenon in case two waves of different frequencies are superposed is generally observed. This invention has the technical meaning to solve the problems caused by this. In addition, though the HF wave was to generate the self-biasing voltage for the ion-incidence electric field, it may be applied for another purpose. For example, it is applied to generate the self-biasing voltage for electro-statically chucking the substrate 9 on the substrate holder 5. When the substrate 9 is in contact with plasma, electrostatic chucking of the substrate 9 is also enabled by generating the self-biasing voltage at the substrate 9. This is because the plasma itself works as the opposite-side electrode. The power-supply monitor 43 may monitor directly the level of the coupled power with the plasma. To Monitor directly the level of the coupled power with the plasma is equivalent to monitoring volume of the reflected wave from the plasma.

Though the etching was described as the example of RF plasma processes, the invention is also applicable to film deposition processes such as sputtering and chemical-vapor-deposition (CVD), surface treatments such as surface oxidation and surface nitrification, and ashing of photoresist. As for the substrate 9 to be processed, the invention is also applicable to substrates for display devices such as LCDs and plasma displays, and substrates for magnetic devices such as magnetic heads.

What is claimed is:

1. An RF plasma processing method, comprising:
    a step for placing a substrate at a required position in a process chamber;
    a step for pumping the process chamber;
    a step for introducing a process gas into the process chamber;
    a step for applying an RF wave of a first frequency to discharge space in the process chamber, thereby igniting RF discharge of the introduced process gas at the discharge space to generate plasma in the process chamber;
    a step for applying another RF wave of a second frequency to the discharge space with a time lag after igniting the RF discharge; and
    a step for carrying out a process onto the substrate, utilizing the generated plasma,
    wherein
        the second frequency is different from the first frequency.

2. The RF plasma processing method as claimed in claim 1, wherein
    the RF wave of the second frequency is applied when the plasma generation by the RF wave of the first frequency is confirmed.

3. The RF plasma processing method as claimed in claim 1, wherein
    the RF wave of the second frequency is applied with a time lag after the plasma generation by the RF wave of the first frequency is confirmed.

4. The RF processing method as claimed in claim 1, wherein
    the RF wave of the second frequency is applied after confirming stabilization of the plasma.

5. The RF plasma processing method as claimed in claim 1, wherein
the RF wave of the second frequency is to generate self-biasing voltage at the substrate.

6. The RF plasma processing method as claimed in claim 1, wherein
the first frequency is in the VHF band, and
the second frequency is in the HF band.

7. The RF plasma processing method as claimed in claim 1, further comprising,
a step for performing a first stage of impedance matching control by providing impedance optimized for igniting the discharge, when application of the wave of the first frequency is started, and
a step for switching the impedance matching control to a second-stage that is performed by providing impedance optimized for stabilizing the plasma.

8. The RF plasma processing method as claimed in claim 7, wherein
the switch to the second-stage impedance matching control is performed when the plasma generation is confirmed.

9. The RF plasma processing method as claimed in claim 7, wherein
the switch to the second-stage impedance matching control is performed after the plasma generation is confirmed.

10. The RF plasma processing method as claimed in claim 7, further comprising
a step for monitoring the reflected wave of the first frequency from the discharge space by a monitor,
wherein
the second-stage impedance matching controls comprises an automatic control of impedance provision so as to minimize the reflected wave of the first frequency, according to the signal from the monitor.

11. The RF plasma processing method as claimed in claim 7, wherein
the second-stage impedance matching control comprises;
a step for initially providing impedance of a preset value,
a step for fixing impedance to be provided at the preset value for a preset time,
a step for monitoring the reflected wave of the first frequency from the discharge space by a monitor, and
a step for switching the impedance matching control to an automatic control of impedance provision so as to minimize the reflected wave of the first frequency, according to the signal from the monitor, when the preset time has passed.

12. The RF plasma processing method as claimed in claim 1, further comprising
a step for monitoring the reflected wave of the second frequency from the discharge space by a monitor, and
a step for performing an automatic control of impedance matching so as to minimize the reflected wave of the second frequency, according to the signal from the monitor.

13. An RF plasma processing method, comprising:
a step for placing a substrate at a required position in a process chamber;
a step for pumping the process chamber;
a step for introducing a process gas into the process chamber;
a step for igniting discharge of the introduced process gas at discharge space to generate plasma in the process chamber by applying an RF wave to the discharge space as impedance matching control is performed, and
a step for carrying out a process onto the substrate, utilizing the generated plasma,
wherein
the impedance matching control comprises
a step for performing a first stage of the impedance matching control by providing impedance optimized for igniting the discharge, when application of the RF wave is started, and
a step for switching the impedance matching control to a second-stage that is performed by providing impedance optimized for stabilizing the plasma.

14. An RF plasma processing method, comprising:
a step for placing a substrate at a required position in a process chamber;
a step for pumping the process chamber;
a step for introducing a process gas into the process chamber;
a step for igniting discharge of the introduced process gas at discharge space to generate plasma in the process chamber by applying an RF wave to the discharge space, as impedance matching is performed;
a step for carrying out a process onto the substrate, utilizing the generated plasma,
a step for monitoring the reflected wave from the discharge space by a monitor,
a step for performing an automatic control of the impedance matching so as to minimize the reflected wave, according the signal from the monitor, during the process onto the substrate,
a step for holding a value of impedance provided in the automatic control in the end of the process,
a step for staring the automatic control in the next process, providing impedance of the held value.

15. An RF plasma processing method, comprising:
a step for placing a substrate at a required position in a process chamber;
a step for pumping the process chamber;
a step for introducing a process gas into the process chamber;
a step for starting igniting discharge of the introduced process gas to generate plasma at discharge space in the process chamber by applying an RF wave to the discharge space, as impedance matching control is performed by providing impedance of a preset value optimized for igniting the discharge;
a step for fixing impedance to be provided at the preset value for a preset time;
a step for monitoring the reflected wave from the discharge space by a monitor; and
a step for switching the impedance matching control to an automatic control of impedance provision so as to minimize the reflected wave, according to the signal from the monitor, when the preset time has passed.

16. An RF plasma processing system, comprising:
a process chamber in which a substrate is placed at a required position;
a pumping line through which the process chamber is pumped;
a gas-introduction line through which a process gas is introduced into the process chamber;

an RF electrode provided in the process chamber;
a first RF power source for applying an RF wave of a first frequency to the RF electrode, thereby igniting RF discharge of the introduced process gas at discharge space to generate plasma in the process chamber;
a second RF power source for applying another RF wave of a second frequency to the discharge space; and
a controller in which a sequence control program is installed;
wherein
a process is carried out onto the substrate, utilizing the generated plasma,
the second frequency is different from the first frequency, and
the sequence control program starts operation of the second RF power source with a time lag after starting operation of the first RF power source.

17. The RF plasma processing system as claimed in claim 16, further comprises a plasma-generation monitor, wherein
the sequence control program starts operation of the second RF power source when the plasma generation by the RF wave of the first frequency is confirmed according to the signal from the plasma-generation monitor.

18. The RF plasma processing system as claimed in claim 16, further comprises a plasma-generation monitor, wherein
the sequence control program starts operation of the second RF power source after the plasma generation by the RF wave of the first frequency is confirmed according to the signal from the plasma-generation monitor.

19. The RF processing system as claimed in claim 16, wherein
the sequence control program starts operation the second RF power source after confirming stabilization of the plasma.

20. The RF plasma processing system as claimed in claim 16, wherein
the RF wave of the second frequency is to generate self-biasing voltage at the substrate.

21. The RF plasma processing system as claimed in claim 16, wherein
the first frequency is in the VHF band, and
the second frequency is in the HF band.

22. The RF plasma processing method as claimed in claim 16, further comprising
an impedance matching element provided at a line connecting the first RF power source and the RF electrode, wherein
the sequence control program
starts operation of the first RF power source as a first stage of impedance matching control is performed, and
afterward, switches the impedance matching control to a second stage,
the first stage being performed by making the impedance matching element provide impedance optimized for igniting the discharge,
the second stage being performed by making the impedance matching element provide impedance optimized for stabilizing the plasma.

23. The RF plasma processing system as claimed in claim 22, wherein
the sequence control program switches the impedance matching control to the second stage when the plasma generation is confirmed.

24. The RF plasma processing system as claimed in claim 22, wherein
the sequence control program switches the impedance matching control to the second stage after the plasma generation is confirmed.

25. The RF plasma processing system as claimed in claim 22, further comprising
a monitor for monitoring the reflected wave of the first frequency from the discharge space,
wherein
the sequence control program performs an automatic control of impedance to be provided so as to minimize the reflected wave of the first frequency from the discharge space, according to the signal from the monitor, in the second-stage impedance matching control.

26. The RF plasma processing system as claimed in claim 22, further comprising
a monitor for monitoring the reflected wave of the first frequency from the discharge space,
wherein
the sequence control program
starts operation of the first RF power source as making the impedance matching element initially provide impedance of a preset value,
fixes impedance to be provided at the preset value for a preset time,
monitors the reflected wave of the first frequency from the discharge space by the monitor, and
switches the impedance matching control to an automatic control of impedance provision so as to minimize the reflected wave of the first frequency, according to the signal from the monitor, when the preset time has passed.

27. The RF plasma processing method as claimed in claim 16, further comprising
a monitor for monitoring the reflected wave of the first frequency from the discharge space, and
an impedance matching element provided on a line from the second RF power source to the discharge space,
wherein
the sequence control program performs an automatic control of impedance provision by the impedance matching element so as to minimizing the reflected wave of the second frequency, according to the signal from the monitor.

28. An RF plasma processing system, comprising:
a process chamber in which a substrate is placed at a required position;
a pumping line through which the process chamber is pumped;
a gas-introduction line through which a process gas is introduced into the process chamber;
an RF electrode provided in the process chamber;
a RF power source for applying an RF wave to the RF electrode; thereby igniting RF discharge of the introduced process gas at discharge space to generate plasma in the process chamber;
an impedance matching element provided on a line connecting the RF power source and the RF electrode; and
a controller in which a sequence control program is installed;

wherein
- a process is carried out onto the substrate, utilizing the generated plasma; and
- the sequence control program
  - starts operation of the RF power source as making the impedance matching element initially provide impedance of a preset value,
  - fixes impedance to be provided at the preset value for a preset time,
  - monitors the reflected wave from the discharge space by the monitor, and
  - switches the impedance matching control to an automatic control of impedance provision so as to minimize the reflected wave, according to the signal from the monitor, when the preset time has passed.

29. An RF plasma processing system, comprising:
a process chamber in which a substrate is placed at a required position;
a pumping line through which the process chamber is pumped;
a gas-introduction line through which a process gas is introduced into the process chamber;
an RF electrode provided in the process chamber;
an RF power source for applying an RF wave to the RF electrode, thereby igniting RF discharge of the introduced process gas at discharge space to generate plasma in the process chamber;
an impedance matching element provided on a line connecting the RF power source and the RF electrode;
a controller in which a sequence control program is installed; and
a monitor for monitoring reflection wave from the discharge space;
wherein
- a process is carried out onto the substrate, utilizing the generated plasma; and
- the sequence control program
  - monitors the reflected wave from the discharge space by the monitor,
  - performs an automatic control of the impedance matching so as to minimize the reflected wave, according the signal from the monitor, during the process onto the substrate,
  - holds a value of impedance provided in the automatic control in the end of the process, and
  - starts the automatic control in the next process, providing impedance of the held value.

30. An RF plasma processing system, comprising:
a process chamber in which a substrate is placed at a required position;
a pumping line through which the process chamber is pumped;
a gas-introduction line through which a process gas is introduced into the process chamber;
an RF electrode provided in the process chamber;
a RF power source for applying an RF wave to the RF electrode, thereby igniting RF discharge of the introduced process gas at discharge space to generate plasma in the process chamber;
an imepdance matching element provided on a line connecting the RF power source and the RF electrode;
a controller in which a sequence control program is installed; and
a monitor for monitoring the reflected wave from the discharge space;
wherein
- a process is carried out onto the substrate, utilizing the generated plasma, and
- the sequence control program
  - performs impedance matching control by making the impedance matching element provide impedance of a preset value optimized for igniting the discharge, when application of the RF wave is started,
  - fixes impedance to be provided at the preset value for a preset time,
  - monitors the reflected wave from the discharge space by the monitor, and
  - switches the impedance matching control to an automatic control of impedance provision so as to minimize the reflected wave, according to the signal from the monitor, when the preset time has passed.

* * * * *